(12) United States Patent
Nakaso

(10) Patent No.: US 8,436,511 B2
(45) Date of Patent: May 7, 2013

(54) SPHERICAL SURFACE ACOUSTIC WAVE APPARATUS

(75) Inventor: Noritaka Nakaso, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 133 days.

(21) Appl. No.: 12/929,925

(22) Filed: Feb. 24, 2011

(65) Prior Publication Data

US 2011/0148250 A1    Jun. 23, 2011

Related U.S. Application Data

(63) Continuation of application No. PCT/JP2009/064891, filed on Aug. 26, 2009.

(30) Foreign Application Priority Data

| Aug. 26, 2008 | (JP) | 2008-217046 |
| Aug. 26, 2008 | (JP) | 2008-217047 |

(51) Int. Cl.
| H03H 9/05 | (2006.01) |
| H03H 9/25 | (2006.01) |
| H01L 41/053 | (2006.01) |
| H01L 41/107 | (2006.01) |

(52) U.S. Cl.
USPC ......... 310/313 R; 310/348; 310/352; 310/371

(58) Field of Classification Search ............ 310/313 A, 310/313 B, 313 C, 313 D, 313 R, 371, 348, 310/352
See application file for complete search history.

(56) References Cited

U.S. PATENT DOCUMENTS

| 2002/0014809 A1* | 2/2002 | Tsukahara et al. | 310/313 R |
| 2004/0189148 A1* | 9/2004 | Yamanaka et al. | 310/313 R |
| 2006/0214537 A1 | 9/2006 | Nakaso et al. | |
| 2007/0041870 A1* | 2/2007 | Yamanaka et al. | 422/58 |
| 2007/0247022 A1* | 10/2007 | Nakaso et al. | 310/313 R |

FOREIGN PATENT DOCUMENTS

| JP | 2005-094609 | | 4/2005 |
| JP | 2005-328171 | * | 11/2005 |
| JP | 2008-304310 | * | 6/2007 |
| JP | 2008-157855 | | 7/2008 |
| JP | 2009-053015 | * | 3/2009 |
| JP | 2009-074983 | * | 4/2009 |
| JP | 2010-139506 | * | 6/2010 |
| WO | 01/45255 A1 | | 6/2001 |

OTHER PUBLICATIONS

International Preliminary Report on Patentability mailed Apr. 21, 2011 issued in corresponding International Patent Application No. PCT/JP2009/064891.
International Search Report for PCT/JP2009/064244, mailed Oct. 6, 2009.

* cited by examiner

*Primary Examiner* — Thomas Dougherty

(57) ABSTRACT

A spherical surface acoustic wave apparatus includes a surface acoustic wave propagation substrate which has a surface acoustic wave circulation path on an outer surface thereof. The path is configured to be annular and continuous using at least a part of a spherical shape, and is able to be excited to generate surface acoustic wave and allows the excited surface acoustic wave to propagate and circulate therein in its annular and continuous direction. The apparatus further includes a substrate support which supports a region of the outer surface of the substrate, the region excluding the circulation path, and a support for a surface acoustic wave excitation/detection unit, which supports an elastic member supporting the excitation/detection unit, which makes the excitation/detection unit being in contact with the circulation path of the outer surface of the substrate through the elastic member, and which elastically deforms the elastic member.

22 Claims, 15 Drawing Sheets

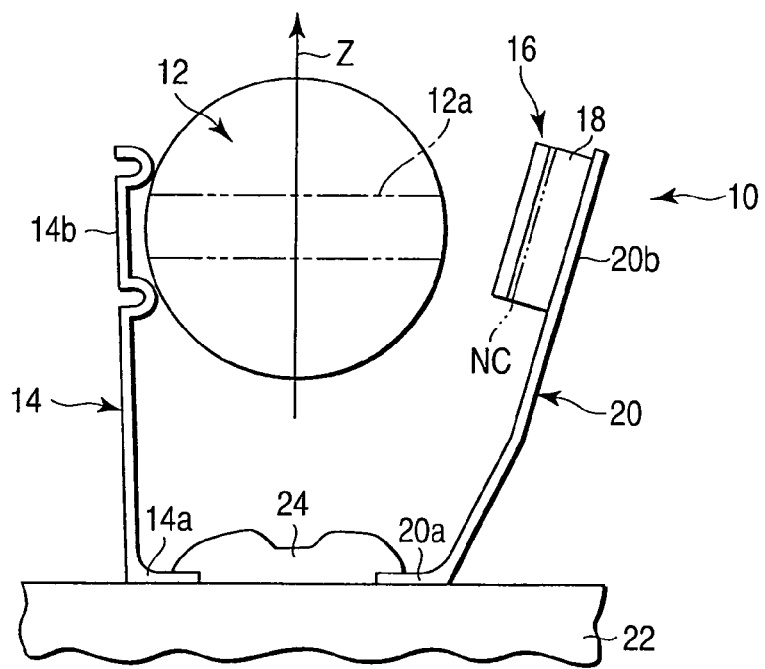
F I G. 1
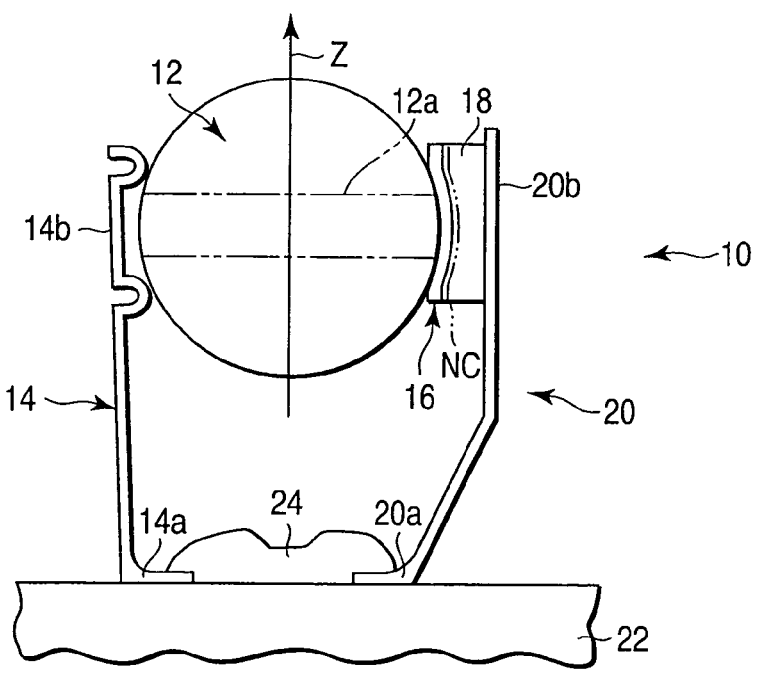
F I G. 2

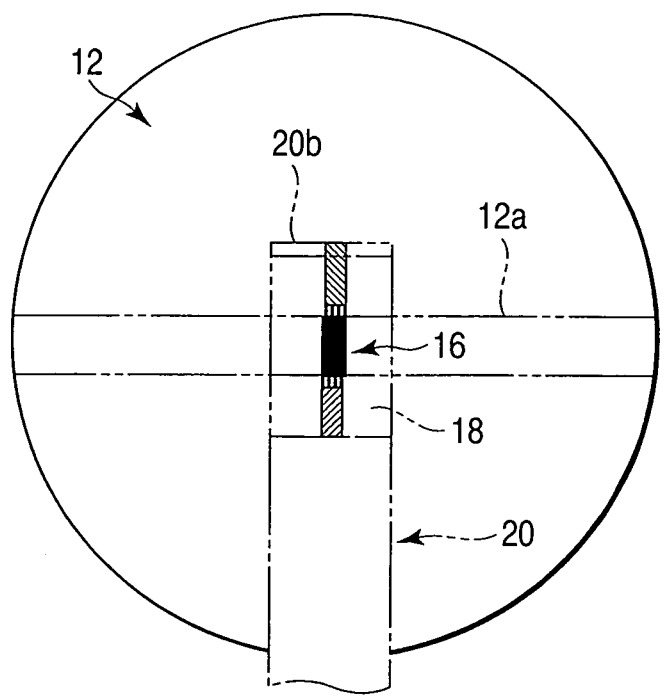
F I G. 3A
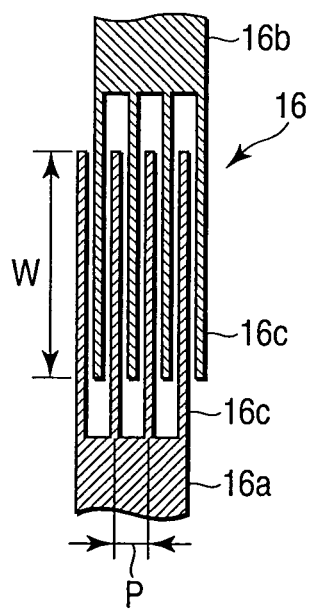
F I G. 3B

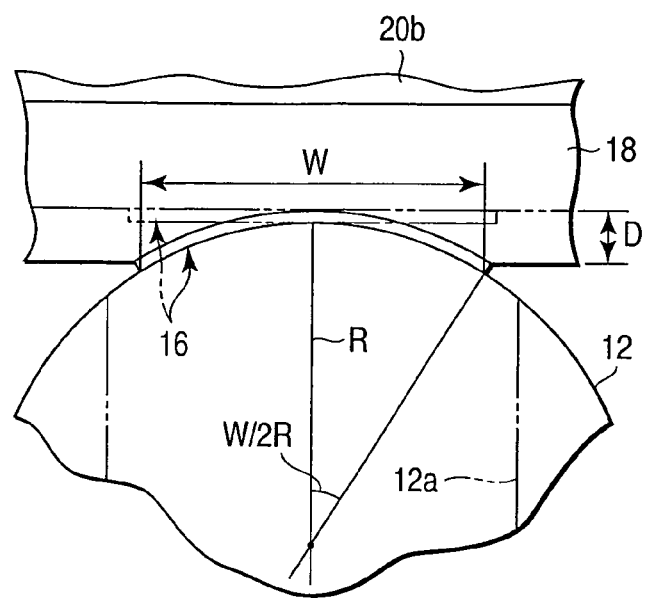
F I G. 4
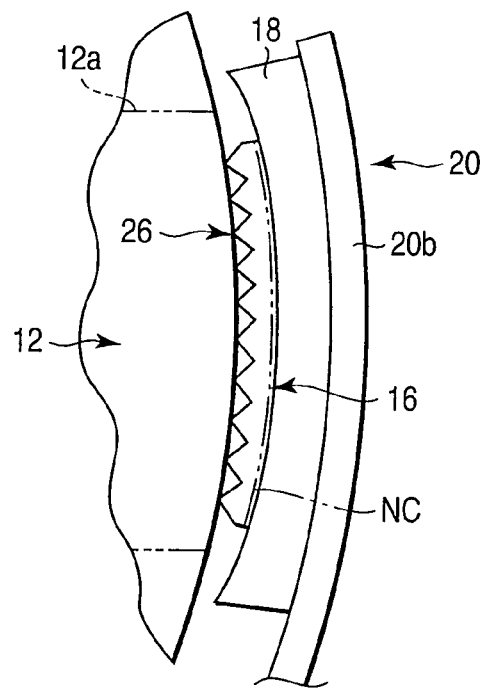
F I G. 5

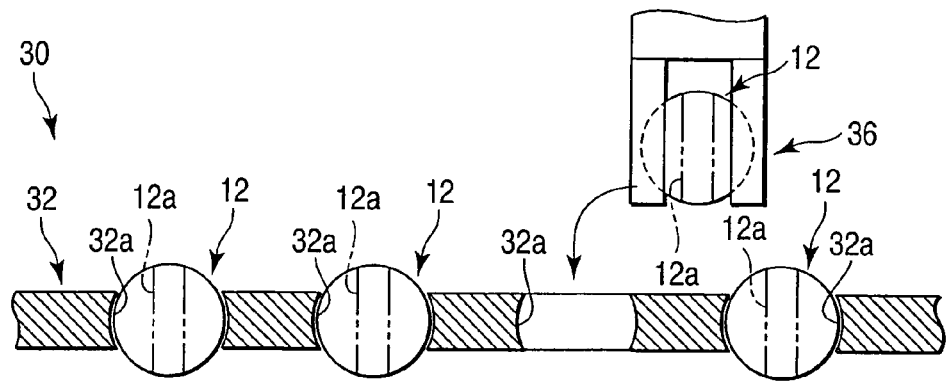
F I G. 8A
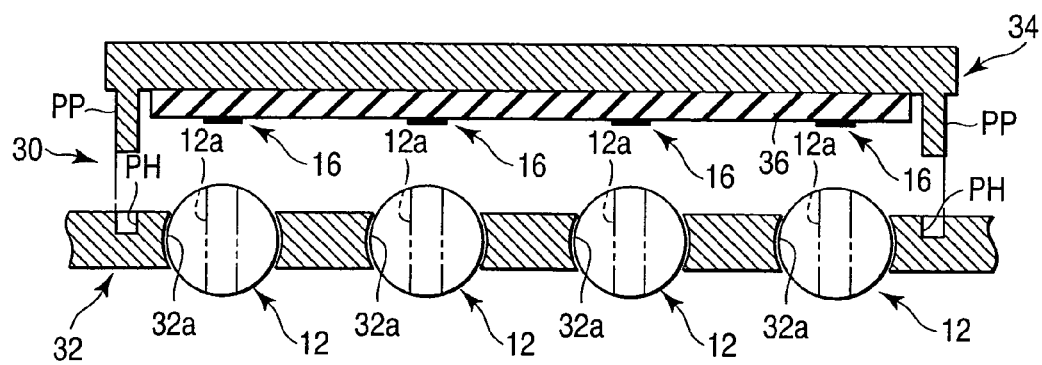
F I G. 8B
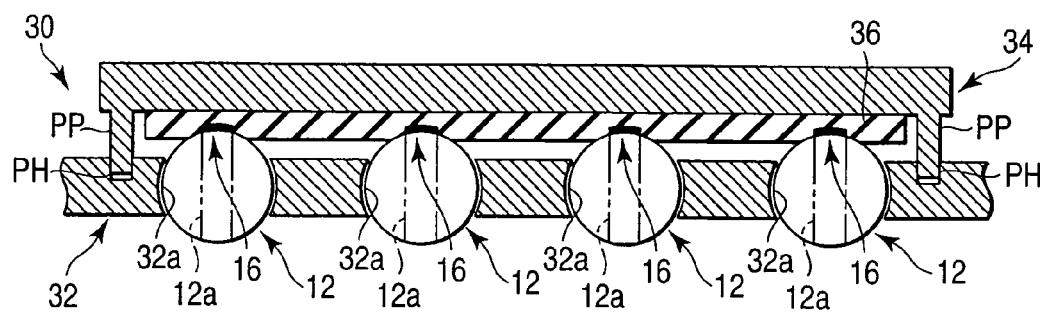
F I G. 8C

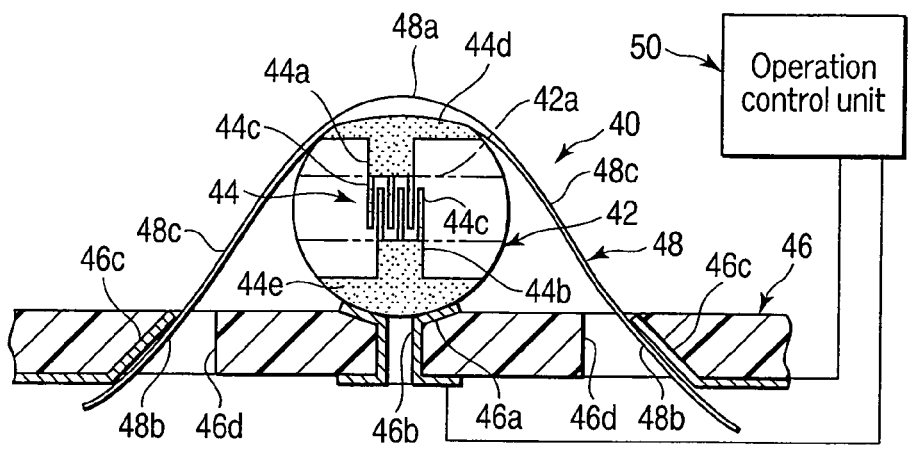
F I G. 9
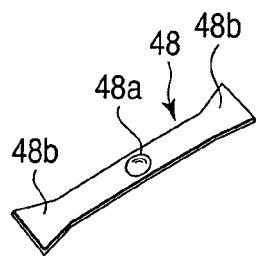
F I G. 10A
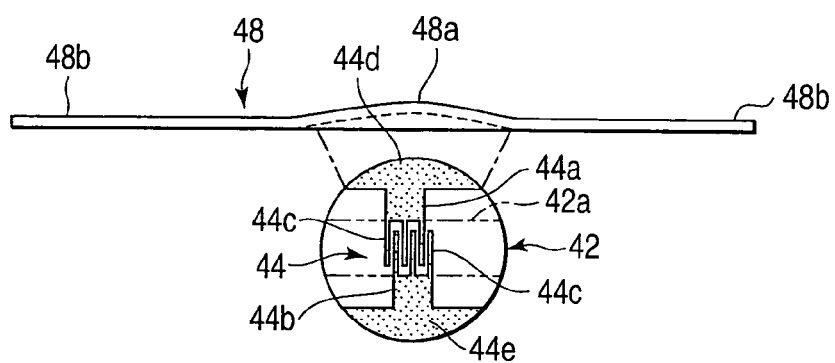
F I G. 10B

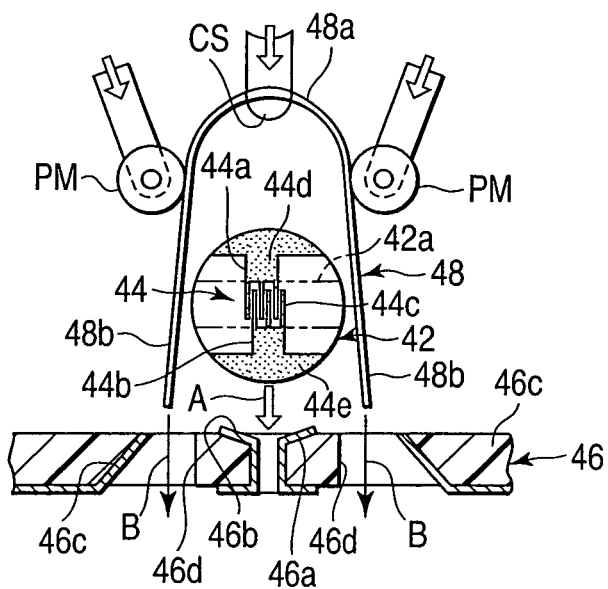
F I G. 10C
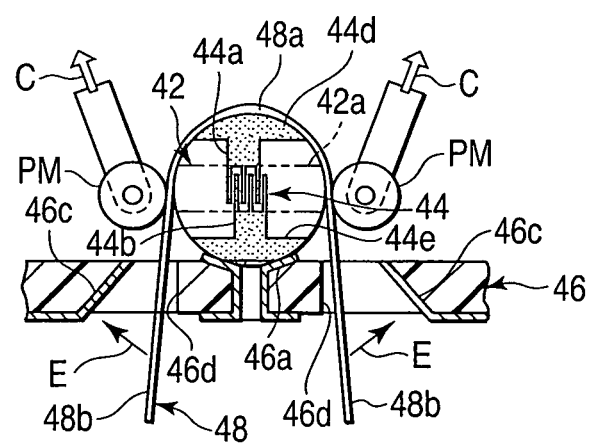
F I G. 10D

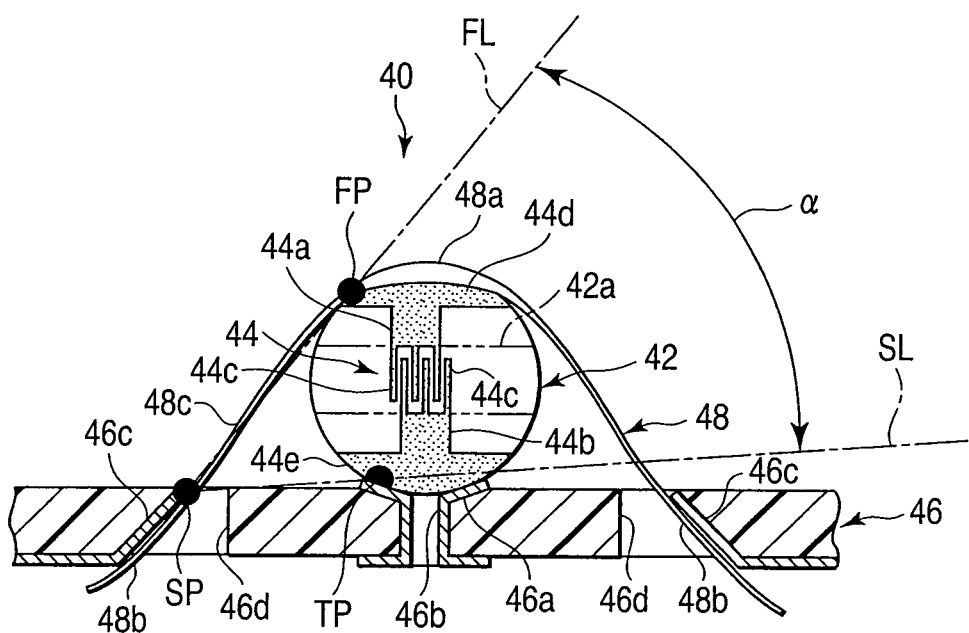
F I G. 11

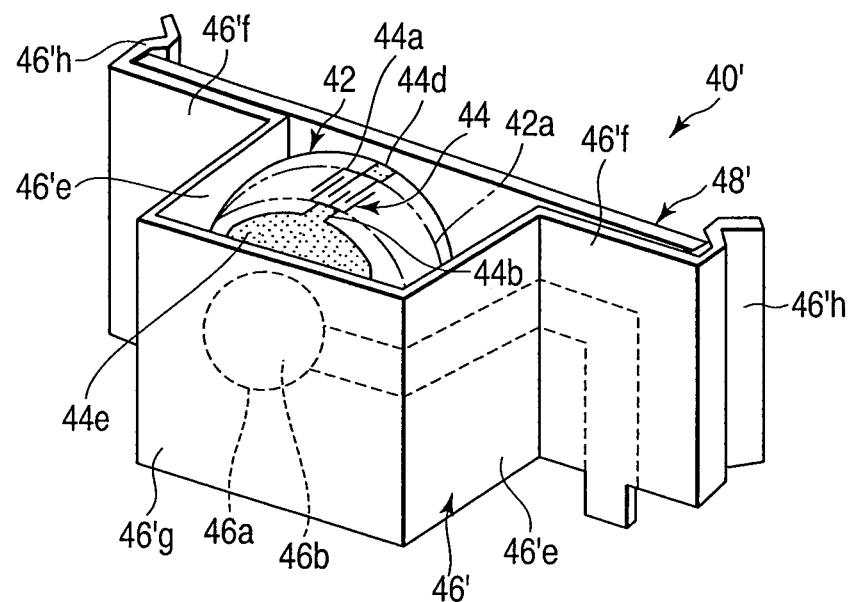
F I G. 12A
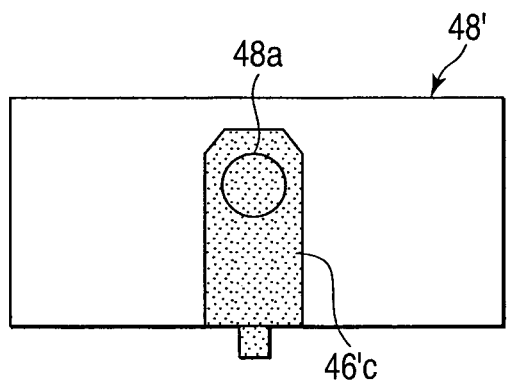
F I G. 12B

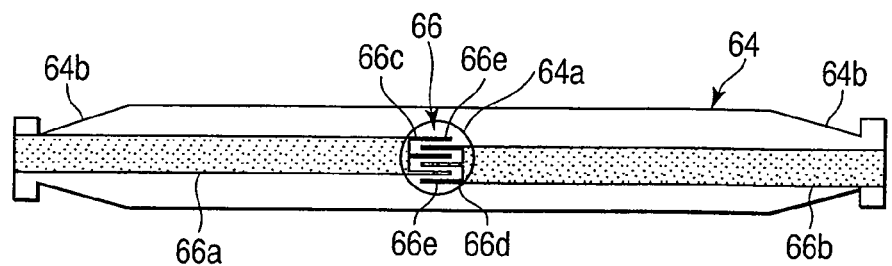
F I G. 13A
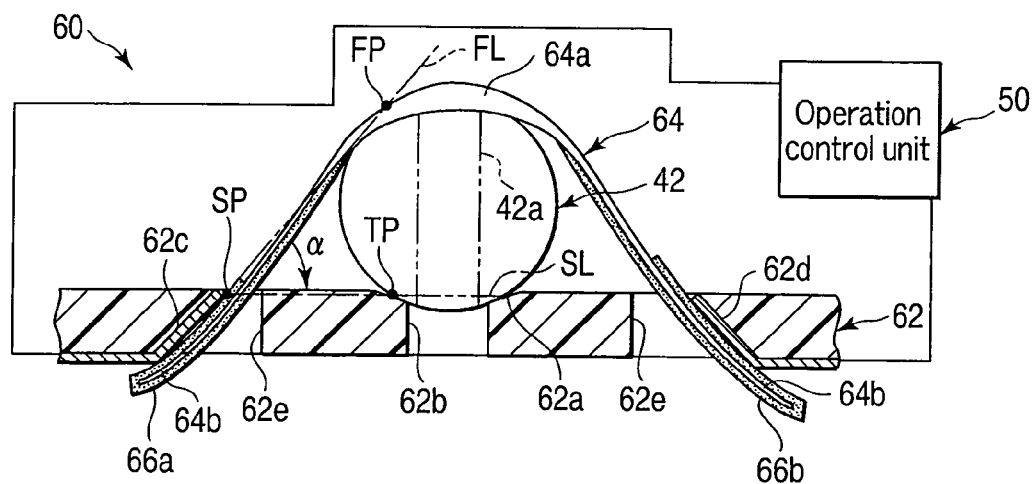
F I G. 13B

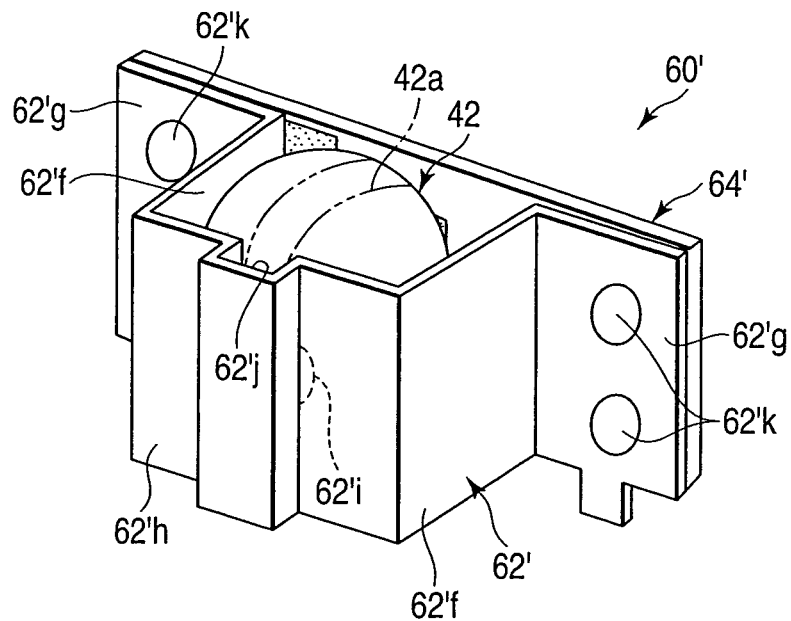
F I G. 14A
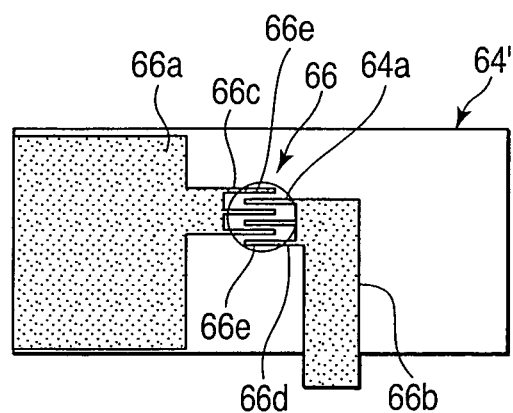
F I G. 14B

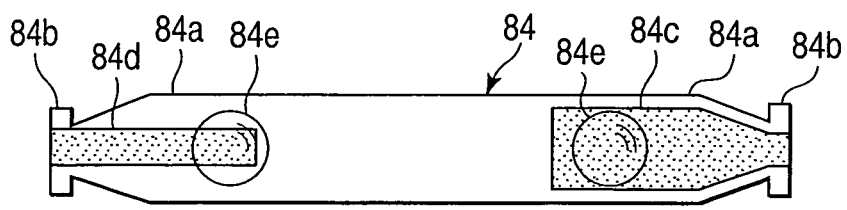
F I G. 16A
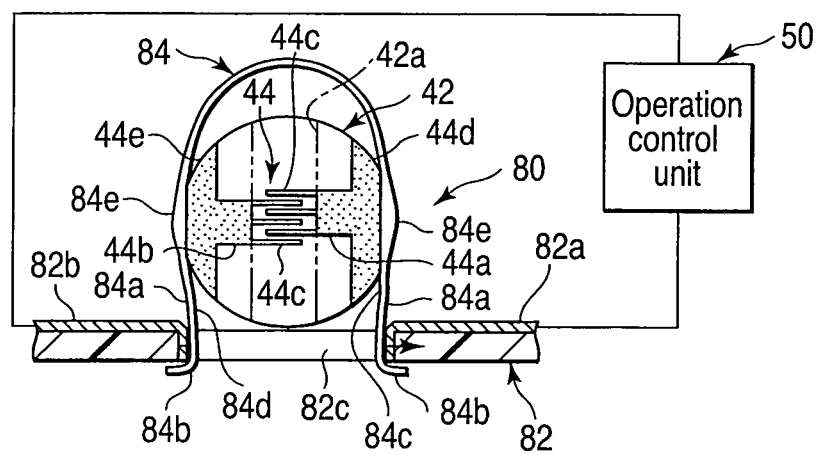
F I G. 16B

SPHERICAL SURFACE ACOUSTIC WAVE APPARATUS

CROSS-REFERENCE TO RELATED APPLICATIONS

This is a Continuation Application of PCT Application No. PCT/JP2009/064891, filed Aug. 26, 2009, which was published under PCT Article 21(2) in Japanese.

This application is based upon and claims the benefit of priority from prior Japanese Patent Applications No. 2008-217046, filed Aug. 26, 2008; and No. 2008-217047, filed Aug. 26, 2008, the entire contents of both of which are incorporated herein by reference.

BACKGROUND OF THE INVENTION

1. Field of the Invention

The present invention relates to a spherical surface acoustic wave apparatus comprising: a surface acoustic wave propagation substrate which includes, on an outer surface thereof, a surface acoustic wave circulation path configured to be annular and continuous using at least a part of a spherical shape, the circulation path being able to be excited to generate a surface acoustic wave therein and to allow the excited surface acoustic wave propagate and circulate therein in an annular and continuous direction thereof; a substrate supporting unit which is configured to support the surface acoustic wave propagation substrate; and a surface acoustic wave excitation/detection unit which is configured to excite the surface acoustic wave in the surface acoustic wave circulation path of the surface acoustic wave propagation substrate, to make the excited surface acoustic wave propagate and circulate in the annular and continuous direction, to detect the surface acoustic wave circulated in the surface acoustic wave circulation path, and to emit a reception signal corresponding to the detected surface acoustic wave.

2. Description of the Related Art

The above-described spherical surface acoustic wave apparatus is already well known, for example by FIGS. 1 and 7 of Japanese Patent Application KOKAI Publication No. 2005-94609.

The surface acoustic wave propagation substrate is formed by preparing a base material formed to include, on an outer surface thereof, a portion configured to be annular and continuous using at least a part of a spherical shape with a material which is not able to be excited to generate a surface acoustic wave, and by coating at least the annular portion on the outer surface of the base material with a material capable of being excited to generate the surface acoustic wave.

Alternatively, the surface acoustic wave propagation substrate is formed to include, on the outer surface thereof, the portion configured to be annular and continuous using at least the part of the spherical shape with a material capable of being excited to generate the surface acoustic wave.

A piezoelectric material is generally used as the material capable of being excited to generate the surface acoustic wave.

When forming an entire surface acoustic wave propagation substrate of the material capable of being excited to generate the surface acoustic wave, a piezoelectric crystal material such as quartz, lithium niobate ($LiNbO_3$), lithium tantalate ($LiTaO_3$), langasite ($La_3Ga_5SiO_{14}$) and a family thereof is used. When forming the surface acoustic wave propagation substrate of the piezoelectric crystal material, the annular continuous portion is extended along a line at which a crystal face of the piezoelectric crystal material intersects with the outer surface of the piezoelectric crystal material. That is to say, in the outer surface of the piezoelectric crystal material, the surface acoustic wave can propagate only in an extending direction of the intersection line.

Then, the surface acoustic wave propagation substrate of the piezoelectric crystal material is formed into the spherical shape generally having a diameter of substantially 10 mm to substantially 1 mm in consideration of a manufacturing cost and various physical conditions required for circulating the surface acoustic wave (including a radius of curvature in a width direction of the annular continuous portion and a width and a frequency of the surface acoustic wave which should be excited in the annular continuous portion).

Although the surface acoustic wave excitation/detection unit may have various configurations, a so-called reed screen shaped electrode (also referred to as a comb-shaped electrode) is used in general in consideration of a manufacturing cost, an entire size of the unit, a conversion efficiency and the like.

The most basic reed screen shaped electrode has a shape in which a pair of comb-shaped terminal portions are combined such that a plurality of teeth like electrode branches of one comb-shaped terminal portions are alternately arranged with a plurality of teeth like electrode branches of another comb-shaped terminal portions.

The reed screen shaped electrode is directly formed on the annular continuous portion on the outer surface of the surface acoustic wave propagation substrate by for example photolithography (photoengraving), such that the teeth like electrode branches are arranged along an extending direction of the annular continuous portion. Alternatively, the reed screen shaped electrode is directly formed by for example the photolithography (photoengraving) on a bottom surface of a partial spherical concave of a reed screen shaped electrode supporting member independent of the surface acoustic wave propagation substrate, the partial spherical concave being formed so as to be similar to a part of the annular continuous portion on the outer surface of the piezoelectric crystal material. The reed screen shaped electrode formed on the bottom surface of the partial spherical concave of the reed screen shaped electrode supporting member is faced to the annular continuous portion on the outer surface of the surface acoustic wave propagation substrate through a predetermined gap (one-quarter or less of a wavelength of the surface acoustic wave to be excited) and is arranged such that the plurality of teeth like electrode branches are arranged along the extending direction of the annular continuous portion.

By applying in a burst manner a high-frequency signal of a predetermined frequency between the pair of comb-shaped terminals, it is possible to excite a surface acoustic wave having a wavelength corresponding to a period of arrangement of the plurality of the teeth like electrode branches of the pair of comb-shaped terminals combined to each other (that is to say, a distance between two teeth like electrode branches adjacent to each other) in the annular continuous portion on the outer surface of the surface acoustic wave propagation substrate, and a width of the excited surface acoustic wave corresponds to a length of each of portions of the two adjacent teeth like electrode branches, at the portions the two adjacent teeth like electrode branches being faced to each other.

The direction in which the plurality of the teeth like electrode branches of the pair of comb-shaped terminals of the reed screen shaped electrode are alternately arranged is substantially a direction of movement of a wave front of the surface acoustic wave excited as described above in the annular continuous portion on the outer surface of the piezoelectric crystal material. Therefore, the surface acoustic wave excited by the reed screen shaped electrode on the annular continuous portion on the outer surface of the surface acoustic wave propagation substrate propagates in the continuous direction of the annular continuous portion in the annular continuous portion.

For example, the International Publication No. WO 01/45255 A1 discloses an example of various condition settings for allowing the surface acoustic wave excited in the annular continuous portion on the outer surface of the surface acoustic wave propagation substrate to propagate in the continuous direction of the annular continuous portion and repeatedly circulate without diffusing in a direction orthogonal to the direction.

The condition includes a curvature of the annular continuous portion on the outer surface of the surface acoustic wave propagation substrate, a width of the surface acoustic wave (the length of each of the portions of the two adjacent teeth like electrode branches, at the portions the two adjacent teeth like electrode branches being faced to each other when the surface acoustic wave excitation/detection unit is the reed screen shaped electrode) excited in the annular continuous portion in the direction orthogonal to the continuous direction of the annular continuous portion (that is to say, the direction in which the excited surface acoustic wave is propagated), and the frequency of the surface acoustic wave excited in the annular continuous portion.

By providing a sensitive film sensitive to change in an external environment on the annular continuous portion (that is to say, the surface acoustic wave circulation path) on the outer surface of the surface acoustic wave propagation substrate, the spherical surface acoustic wave apparatus can measure a change in the external environment such as a gas concentration with which the sensitive film is brought into contact with high sensitivity.

In detail, the sensitive film changes a propagation speed of the surface acoustic wave which circulates in the circulation path and an attenuation rate of vibration energy of the circulated surface acoustic wave, corresponding to the change in the external environment such as the gas concentration with which the sensitive film is brought into contact, and further changes a time required for one circulation of a burst-like surface acoustic wave in the circulation path obtained by an output from the surface acoustic wave excitation/detection unit and changes a phase and strength of the surface acoustic wave for each circulation, so that the change in the external environment can be obtained by measuring these changes.

The phase in the high-frequency signal means a position of a predetermined high-frequency signal at a predetermined time in general. A phase measurement in the spherical surface acoustic wave apparatus is generally performed by measuring a position of a high-frequency signal output at a time after a predetermined time period has passed from a time at which the surface acoustic wave is excited using a Fourier analysis, quadrature detection or wavelet conversion based on the output generated from the surface acoustic wave excitation/detection unit at the time after the predetermined time period has passed. Then, from the phase obtained in this manner, the propagation (circulation) speed of the surface acoustic wave can be directly measured.

In this description, obtaining a passed time in the following manner is also referred to as "to measure the phase". In this manner, for example, a passed time is obtained from a time at which the surface acoustic wave excitation/detection unit of the spherical surface acoustic wave apparatus applies the predetermined high-frequency signal in a burst manner to the annular continuous portion on the outer surface of the surface acoustic wave propagation substrate to excite the surface acoustic wave in the annular continuous portion, to a time at which the surface acoustic wave excitation/detection unit finishes to detect the surface acoustic wave which propagates and circulates on the annular continuous portion a predetermined number of times (that is to say, the time at which the surface acoustic wave finishes to circulate on the annular continuous portion a predetermined number of times), that is a passed time is obtained from the time of excitation to the time at which the circulations of the predetermined numbers is finished. The present invention does not exclude to obtain the propagation (circulation) speed of the surface acoustic wave in the annular continuous portion thereby.

For example, when a concentration of a predetermined gas in an external environment increases while the sensitive film of the annular continuous portion on the outer surface of the surface acoustic wave propagation substrate is in contact with the external environment and the sensitive film senses the concentration of the predetermined gas, a circulation speed of the burst-like surface acoustic wave which circulates in the annular continuous portion (that is to say, the surface acoustic wave circulation path) increases or decreases due to an effect of a change of the sensitive film which corresponds to the change in the gas concentration, and further a time required for one circulation of the burst-like surface acoustic wave in the circulation path decreases or increases. In this case, advance or delay occurs in a phase of the surface acoustic wave for each circulation and an attenuation rate of deterioration in strength increases or decreases.

Although each of the change in the circulation speed, the change in the circulation time, the advance or delay of the phase, and increase or decrease of the attenuation rate, each occurred by the above-described change in the external environment, is minute, each of the change, the advance or delay, and the increase or decrease is superposed with increase in the number of circulations of the surface acoustic wave in the circulation path and becomes larger. That is to say, accuracy in measurement of the change in the external environment is improved.

Therefore, when measuring the change in the external environment as described above using the spherical surface acoustic wave apparatus, it is clearly not preferable that the attenuation rate of the vibration energy of the surface acoustic wave which circulates in the circulation path increases and decreases by a factor other than the change in the external environment.

This invention is derived from the above described circumstances, and an object of the present invention is to provide a spherical surface acoustic wave apparatus which is simple in structure and easy to manufacture, which is capable of surely installing a surface acoustic wave propagation substrate including a portion annularly and continuously formed using a part of a spherical shape on an outer surface thereof to be able to excite a surface acoustic wave and to allow the surface acoustic wave to propagate and circulate therein, so that a change in an external environment can be measured always with high accuracy, and which is capable of changing the surface acoustic wave propagation substrate easily.

BRIEF SUMMARY OF THE INVENTION

In order to achieve the above described object of the invention, a spherical surface acoustic wave apparatus according to the invention comprises: a surface acoustic wave propagation substrate which includes, on an outer surface thereof, a surface acoustic wave circulation path configured to be annular and continuous using at least a part of a spherical shape, the circulation path being able to be excited to generate a surface acoustic wave therein and to allow the excited surface acoustic wave propagate and circulate therein in an annular and continuous direction thereof; a substrate support which is configured to support a region on the outer surface of the surface acoustic wave propagation substrate, the region excluding the surface acoustic wave circulation path; a surface acoustic wave excitation/detection unit which is configured to excite the surface acoustic wave in the surface acoustic wave circulation path of the surface acoustic wave propagation substrate, to make the excited surface acoustic wave propagate, and circulate in the annular and continuous direction, to detect the surface acoustic wave circulated in the surface acoustic wave circulation path, and to emit a reception signal corresponding to the detected surface acoustic wave; and a support for an excitation/detection unit, which supports an elastic deformation member supporting the surface acoustic wave excitation/detection unit, which makes the surface acoustic wave excitation/detection unit being in contact with the surface acoustic wave circulation path of the outer surface of the surface acoustic wave propagation substrate through the elastic deformation member, and which elastically deforms the elastic deformation member.

In order to achieve the above described object of the invention, another spherical surface acoustic wave apparatus according to the invention comprises: a surface acoustic wave propagation substrate which includes, on an outer surface thereof, a surface acoustic wave circulation path configured to be annular and continuous using at least a part of a spherical shape, the circulation path being able to be excited to generate a surface acoustic wave therein and to allow the excited surface acoustic wave propagate and circulate therein in an annular and continuous direction thereof; a substrate supporting unit which is configured to support the surface acoustic wave propagation substrate; and a surface acoustic wave excitation/detection unit which excites and circulates the surface acoustic wave in the surface acoustic wave circulation path on the outer surface of the surface acoustic wave propagation substrate and which detects the circulated surface acoustic wave. And, the substrate supporting unit comprises: a substrate support which includes a substrate seat on which a region on the outer surface of the surface acoustic wave propagation substrate is seated, the region excluding the surface acoustic wave circulation path; and a substrate elastic holder which generates elastic resistance against bending, which has a contact portion being brought into contact with a portion on the outer surface of the surface acoustic wave propagation substrate mounted on the substrate seat of the substrate support, the portion on the outer surface excluding the surface acoustic wave circulation path and being opposite to the substrate seat of the substrate support, which is pressed at both sides of the contact portion against the elastic resistance toward the substrate support, and which is fixed at end portions of the both sides to positions away from the substrate seat on both sides of the substrate seat on the substrate support.

In order to achieve the above described object of the invention, a further spherical surface acoustic wave apparatus according to the invention comprises: a surface acoustic wave propagation substrate which includes, on an outer surface thereof, a surface acoustic wave circulation path configured to be annular and continuous using at least a part of a spherical shape, the circulation path being able to be excited to generate a surface acoustic wave therein and to allow the excited surface acoustic wave propagate and circulate therein in an annular and continuous direction thereof; a substrate supporting unit which is configured to support the surface acoustic wave propagation substrate; and a surface acoustic wave excitation/detection unit which excites and circulates the surface acoustic wave in the surface acoustic wave circulation path on the outer surface of the surface acoustic wave propagation substrate and which detects the circulated surface acoustic wave. And, the substrate supporting unit comprises: a substrate support which includes a substrate seat on which a region on the outer surface of the surface acoustic wave propagation substrate is seated, the region excluding the surface acoustic wave circulation path; and a substrate elastic holder which generates elastic resistance against bending, which has a contact portion being brought into contact with a portion of the surface, acoustic wave circulation path on the outer surface of the surface acoustic wave propagation substrate mounted on the substrate seat of the substrate support, the portion of the surface acoustic wave circulation path being opposite to the substrate seat of the substrate support, which is pressed at both sides of the contact portion against the elastic resistance toward the substrate support, and which is fixed at end portions of the both sides to positions away from the substrate seat on both sides of the substrate seat on the substrate support. And, the surface acoustic wave excitation/detection unit is provided on the contact portion of the substrate elastic holder.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 1 is a side view schematically illustrating a state of a spherical surface acoustic wave apparatus according to a first embodiment of the invention, in the state a surface acoustic wave excitation/detection unit being just before to be brought into contact with a surface acoustic wave circulation path being an annular continuous portion on an outer surface of a spherical surface acoustic wave propagation substrate by an extended end portion of an excitation/detection unit support through an elastic deformation member while a region on the outer surface of the spherical surface acoustic wave propagation substrate, the region excluding the surface acoustic wave circulation path, is supported by an extended end portion of a substrate support.

FIG. 2 is a side view schematically illustrating a state of the spherical surface acoustic wave apparatus of FIG. 1, in the state the surface acoustic wave excitation/detection unit being brought into contact with the surface acoustic circulation path by the extended end portion of the excitation/detection unit support through the elastic deformation member while the region on the outer surface of the spherical surface acoustic wave propagation substrate, the region excluding the surface acoustic wave circulation path, is supported by the extended end portion of the substrate support, and in this state the surface acoustic wave propagation substrate being elastically sandwiched by the extended end portion of the substrate support and the extended end portion of the excitation/detection unit support so as to be separated from a base.

FIG. 3A is a schematic view illustrating a state in which the surface acoustic wave excitation/detection unit is brought into contact with the surface acoustic wave circulation path on the outer surface of the surface acoustic wave propagation substrate through the elastic deformation member by the extended end portion of the excitation/detection unit support, as shown FIG. 2, and in which the elastic deformation member and the extended end portion of the excitation/detection unit support are illustrated by imaginary lines.

FIG. 3B is an enlarged view of a comb-shaped electrode as the surface acoustic wave excitation/detection unit.

FIG. 4 is a schematic top view illustrating a preferable degree of an elastic deformation of the elastic deformation member when the surface acoustic wave excitation/detection unit is brought into contact with the surface acoustic wave circulation path on the outer surface of the spherical surface acoustic wave propagation substrate by the extended end portion of the excitation/detection unit support through the elastic deformation member, as shown in FIG. 2.

FIG. 5 is an enlarged schematic side view of the surface acoustic wave excitation/detection unit, the elastic deformation member and the extended end portion of the excitation/detection unit support in a state in which the surface acoustic wave excitation/detection unit is brought into contact with the surface acoustic wave circulation path on the outer surface of the surface acoustic wave propagation substrate by the extended end portion of the excitation/detection unit support through the elastic deformation member, as shown in FIG. 2.

FIG. 8A is a schematic vertical cross-sectional view of a state in which a plurality of spherical surface acoustic wave propagation substrates are supported by a substrate support with a part of a surface acoustic wave circulation path on an outer surface thereof externally exposed from one surface of the substrate support respectively in a spherical surface acoustic wave apparatus according to a second embodiment of the present invention.

FIG. 8B is a schematic vertical cross-sectional view of a state just before an excitation/detection unit support of the spherical surface acoustic wave apparatus according to the second embodiment of the invention is detachably fixed to a predetermined position on the one surface of the substrate support in FIG. 8A.

FIG. 8C is a schematic vertical cross-sectional view of a state in which the excitation/detection unit support in FIG. 8B is detachably fixed to the predetermined position on the one surface of the substrate support in FIG. 8B, so that an elastic deformation member of the excitation/detection unit support brings excitation/detection units into contact with the exposed parts of the surface acoustic wave circulation paths on the outer surfaces of the plurality of surface acoustic wave propagation substrates supported by the substrate support and is elastically deformed.

FIG. 9 is a schematic vertical cross-sectional view of a spherical surface acoustic wave apparatus according to a third embodiment of the invention.

FIG. 10A is a schematic perspective view of a band plate-shaped substrate elastic holder used in the spherical surface acoustic wave apparatus according to the third embodiment of the present invention.

FIG. 10B is a schematic side view illustrating the substrate elastic holder in FIG. 10A and the surface acoustic wave propagation substrate supported on a substrate support by the substrate elastic holder.

FIG. 10C is a schematic vertical cross-sectional view illustrating a state before end portions of the substrate elastic holder of FIG. 10B located on both sides of the surface acoustic wave propagation substrate together with the surface acoustic wave propagation substrate are fixed to the substrate support.

FIG. 10D is a schematic vertical cross-sectional view illustrating a state just before the end portions of the substrate elastic holder of FIG. 10B located on the both sides of the surface acoustic wave propagation substrate together with the surface acoustic wave propagation substrate are fixed to the substrate support.

FIG. 11 is a schematic vertical cross-sectional view illustrating a state after the end portions of the substrate elastic holder of FIG. 10B located on the both sides of the surface acoustic wave propagation substrate together with the surface acoustic wave propagation substrate are fixed to the substrate support.

FIG. 12A is a schematic perspective view of a modification of the spherical surface acoustic wave apparatus according to the third embodiment of the present invention.

FIG. 12B is a schematic front view of the substrate elastic holder of the modification shown in FIG. 12A.

FIG. 13A is a schematic rear view of a band plate-shaped substrate elastic holder used in a spherical surface acoustic wave apparatus according to a fourth embodiment of the present invention.

FIG. 13B is a schematic vertical cross-sectional view of a state in which end portions of the substrate elastic holder in FIG. 13A located on both sides of the surface acoustic wave propagation substrate together with the surface acoustic wave propagation substrate are fixed to a substrate support in the spherical surface acoustic wave apparatus according to the fourth embodiment of the present invention.

FIG. 14A is a schematic perspective view of a modification of the spherical surface acoustic wave apparatus according to the fourth embodiment of the present invention.

FIG. 14B is a schematic front view of the substrate elastic holder of the modification in FIG. 14A.

FIG. 16A is a schematic rear view of a band plate-shaped substrate elastic holder used in a spherical surface acoustic wave apparatus according to a sixth embodiment of the present invention.

FIG. 16B is a schematic vertical cross-sectional view of a state in which end portions of a pair of both side of the band plate-shaped substrate elastic holder are fixed to a support while the pair of both sides sandwich a surface acoustic wave propagation substrate after the substrate elastic holder in FIG. 16A is bent into a substantially U shape in the spherical surface acoustic wave apparatus according to the sixth embodiment of the present invention.

DETAILED DESCRIPTION OF THE INVENTION

First Embodiment

Figure 6A:
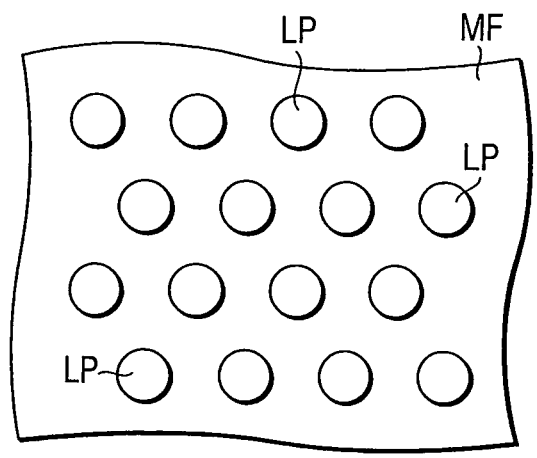
FIG. 6A is an enlarged plane view of a state in which a pattern of a plurality of resist materials are applied to a metal thin film which is a basis of the surface acoustic wave excitation/detection unit, before a contacting area decreasing process to be applied to a surface of the surface acoustic wave excitation/detection unit shown in FIG. 5 is performed by etching.

A spherical surface acoustic wave apparatus 10 according to a first embodiment of the present invention will be described with reference to FIGS. 1 to 7 in the appended drawings.

The spherical surface acoustic wave apparatus 10 is provided with a surface acoustic wave propagation substrate 12. The surface acoustic wave propagation substrate 12 can be configured by preparing a base material formed to include, on an outer surface thereof, a portion configured to be annular and continuous using at least a part of a spherical shape with a material which is not able to be excited to generate a surface acoustic wave, and by coating the annular continuous portion on the outer surface of the base material with a material capable of being excited to generate the surface acoustic wave. Alternatively, the surface acoustic wave propagation substrate 12 is formed to include, on the outer surface thereof, the portion configured to be annular and continuous using at least the part of the spherical shape with a material capable of being excited to generate the surface acoustic wave.

In this embodiment, an entire surface acoustic wave propagation substrate 12 is formed of the material capable of being excited to generate the surface acoustic wave into a spherical shape and includes, on the outer surface thereof, a surface acoustic wave circulation path 12a configured to be annular and continuous using at least a part of the spherical shape in which a surface acoustic wave can be excited and the excited surface acoustic wave can propagate and circulate in a continuous direction of the annular shape.

As the material capable of being excited to generate the surface acoustic wave, a piezoelectric crystal material such as quartz, lithium niobate ($LiNbO_3$), lithium tantalate ($LiTaO_3$), langasite ($La_3Ga_5SiO_{14}$) and a family thereof is used, for example. In this case, the portion configured to be annular and continuous using at least a part of the spherical shape is on a line at which a crystal face of the piezoelectric crystal material intersects with the outer surface of the spherical shape of the surface acoustic wave propagation substrate 12, and the continuous direction of the annular shape is substantially an extending direction of the intersection line.

The surface acoustic wave propagation substrate 12 of the piezoelectric crystal material is generally formed into the spherical shape having a diameter of substantially 10 mm to substantially 1 mm in consideration of a manufacturing cost. The diameter of the surface acoustic wave propagation substrate 12 according to the embodiment is 3.3 mm.

In this embodiment, the surface acoustic wave propagation substrate 12 is formed of spherical quartz. In the spherical quartz, a maximum outer circumferential line around a crystal axis Z, which corresponds to an equator on a spherical outer surface of the quartz when considering the spherical quartz as the earth and considering the crystal axis Z (C axis in a case of the quartz) as an axis of rotation of the earth, is a line at which a crystal face of the quartz intersects with the spherical outer surface of the quartz, and the surface acoustic wave propagation path 12a annularly extends at one time on the outer surface substantially along the maximum outer circumference line.

The spherical surface acoustic wave apparatus 10 is further provided with a substrate support 14 which supports a region on the outer surface of the surface acoustic wave propagation substrate 12, the region excluding the surface acoustic wave circulation path 12a, and an excitation/detection unit support 20 which supports an elastically deformable elastic deformation member 18 supporting a surface acoustic wave excitation/detection unit 16, which makes the surface acoustic wave excitation/detection unit 16 being in contact with the surface acoustic wave circulation path 12a on the outer surface of the surface acoustic wave propagation substrate 12 through the elastic deformation member 18, and which elastically deforms the elastic deformation member 18.

In this embodiment, the substrate support 14 includes a base end portion 14a supported by a base 22 and an extended end portion 14b which extends in a direction away from the base 22, and the extended end portion 14b can be elastically bent with respect to the base end portion 14a. The substrate support 14 can be formed of a material which can be elastically bent as described above. In this embodiment, the substrate support 14 is formed of a stainless plate having a thickness of 0.04 mm. The base end portion 14a of the substrate support 14 is fixed to the base 22 with a known fixing element 24 including soldering, a fixing screw, a rivet or an adhesive.

The extended end portion 14b of the substrate support 14 is configured to support the region on the outer surface of the surface acoustic wave propagation substrate 12, the region excluding the surface acoustic wave circulation path 12a.

In this embodiment, the excitation/detection unit support 20 includes a base end portion 20a which is supported by the base 22 and an extended end portion 20b which extends in a direction away from the base 22, and the extended end portion 20b can be elastically bent with respect to the base end portion 20a. The excitation/detection unit support 20 can also be formed of a material which can be elastically bent as described above, and is formed of a stainless plate having a thickness of 0.04 mm in this embodiment. The base end portion 20a of the excitation/detection unit support 20 is fixed to the base 22 with the known fixing element 24 including the soldering, the fixing screw, the rivet or the adhesive.

The extended end portion 20b of the excitation/detection unit support 20 supports the elastic deformation member 18 and is opposed to the extended end portion 14b of the base support 14 with the surface acoustic wave propagation substrate 12 sandwiched therebetween. Thus, the surface acoustic wave excitation/detection unit 16 is brought into contact with the surface acoustic wave circulation path 12a on the outer surface of the surface acoustic wave propagation substrate 12 as illustrated in FIG. 2.

Therefore, the surface acoustic wave propagation substrate 12 is elastically sandwiched between the extended end portion 14a of the substrate support 14 and the extended end portion of the excitation/detection unit support 20 at a position being away from the base 22.

In this embodiment, the elastic deformation member 18 is formed of rubber which is an electrically nonconductive. However, the elastic deformation member 18 can be formed of a viscoelastic material in case where the material satisfies a condition of elastic deformation which is to be described later or can be formed of a material which becomes hardened over time.

In this embodiment, the surface acoustic wave excitation/ detection unit 16 is provided with a reed screen shaped electrode. The reed screen shaped electrode is configured by combining a pair of comb-shaped terminals 16a and 16b such that a plurality of teeth like electrode branches 16c of one comb-shaped terminal 16a and a plurality of teeth like electrode branches 16c of another comb-shaped terminal 16b are alternately arranged as illustrated in FIGS. 3A and 3B. The reed screen shaped electrode is formed on a surface of the elastic deformation member 18 in a following manner. That is to say, when the reed screen shaped electrode is brought into contact with the surface acoustic wave circulation path 12a of the surface acoustic wave propagation substrate 12 through the elastic deformation member 18 by the extended end portion 20b of the excitation/detection unit support 20, a direction in which the teeth like electrode branches 16c of the pair of comb-shaped terminals 16a and 16b of the reed screen shaped electrode are alternately arranged conforms to an extending direction of the surface acoustic wave circulation path 12a (in the embodiment, a direction along an annular line at which the crystal face around the crystal axis Z of the quarts intersects with the spherical outer surface of the surface acoustic wave propagation substrate 12 of the quartz), and an extending direction of each of the teeth like electrode branches 16c is preferably orthogonal to the extending direction of the surface acoustic wave circulation path 12a.

The reed screen shaped electrode can be formed by directly forming a highly-conductive metal thin film such as gold, copper and aluminum on the surface of the elastic deformation member 18 formed of the rubber which is the electrically nonconductive, and thereafter by shaping the metal thin film by for example photolithography (photoengraving).

However, when the elastic deformation member 18 is brought into contact with the surface acoustic wave circulation path 12a, a contacting portion of the elastic deformation member 18 is elastically deformed and the surface of the contacting portion is slightly extended, so that it is possible that the reed screen shaped electrode is broken by this extension. In order to eliminate the possibility, the reed screen shaped electrode is preferably formed as described above on an electrically nonconductive material such as a ceramic thin film on the contacting portion of the elastic deformation member 18. Although the electrically nonconductive material can be deformed together with the outer surface of the elastic deformation member 18 when the outer surface of the contacting portion of the elastic deformation member 18 is elastically deformed, this is not extended as much as the outer surface of the contacting portion is. That is to say, the reed screen shaped electrode is preferably formed as described above on the electrically nonconductive material interposed between the surface acoustic wave excitation/detection unit 16 provided by the reed screen shaped electrode and the elastic deformation member 18.

Such an electrically nonconductive material can be supported on the outer surface of the contacting portion of the elastic deformation member 18 by a known supporting element including an adhesive, for example, before the reed screen shaped electrode is formed thereon, or can be supported on the outer surface of the contacting portion of the elastic deformation member 18 by the known supporting element including the adhesive, for example, after the reed screen shaped electrode is formed thereon.

The pair of comb-shaped terminals 16a and 16b of the reed screen shaped electrode are electrically connected to a known operation control unit (not illustrated) for controlling an operation of the surface acoustic wave excitation/detection unit 16, through wirings (not illustrated) arranged on the elastic deformation unit 18 and the excitation/detection unit support 20.

When applying a high-frequency signal of a predetermined frequency to the pair of comb-shaped terminals 16a and 16b in a burst manner by the above described known operation control unit while the reed screen shaped electrode of the surface acoustic wave excitation/detection unit 16 is brought into contact with the surface acoustic wave propagation path 12a of the surface acoustic wave propagation substrate 12 as illustrated in FIG. 2 by the extended end portion 20b of the excitation/detection unit support 20 through the elastic deformation member 18, it is possible to excite a surface acoustic wave having a predetermined wavelength in the surface acoustic wave circulation path 12a on the outer surface of the surface acoustic wave propagation substrate 12.

Herein, each of the predetermined frequency and the predetermined wavelength corresponds to a period of arrangement P of the plurality of teeth like electrode branches 16c of the pair of comb-shaped terminals 16a and 16b. A width of the surface acoustic wave excited by the reed screen shaped electrode in the surface acoustic wave circulation path 12a is a distance (electrode width) W with which adjacent two teeth like electrode branches 16c out of the plurality of teeth like electrode branches 16c of the pair of comb-shaped terminals 16a and 16b of the reed screen shaped electrode are opposed to each other.

Although each of the pair of comb-shaped terminals 16a and 16b is configured with four teeth like electrode branches 16c in FIG. 3B, even when each of the pair of comb-shaped terminals 16a and 16b is configured with only one tooth like electrode branch 16c, it is possible to excite and detect the surface acoustic wave, and the present invention does not exclude this. The reed screen shaped electrode that excites the surface acoustic wave only in one direction and the reed screen shaped electrode having a special structure that efficiently excites a plurality of frequencies are known, and the present invention can use either of them.

In order to excite the surface acoustic wave having the predetermined wavelength always under the same condition in the surface acoustic wave circulation path 12a on the outer surface of the surface acoustic wave propagation substrate 12, an entire distance W with which the two adjacent teeth like electrode branches 16c of the pair of comb-shaped terminals 16a and 16b of the reed screen shaped electrode are opposed to one another should be always brought into contact with the surface acoustic wave circulation path 12a while the reed screen shaped electrode of the surface acoustic wave excitation/detection unit 16 is brought into contact with the surface acoustic wave propagation path 12a of the surface acoustic wave propagation substrate 12 through the elastic deformation member 10 by the extended end portion 20b of the excitation/detection unit support 20 as illustrated in FIG. 2.

In order to satisfied with this condition, a depth D of a depression of the elastic deformation member 18 when the elastic deformation member 18 on the extended end portion 20b of the excitation/detection unit support 20 brings the surface acoustic wave excitation/detection unit 16 into contact with the surface acoustic wave circulation path 12 on the outer surface of the surface acoustic wave propagation substrate 12 as illustrated in FIG. 4 must be as follows.

$$D=R(1-\cos(W/2R))$$

Herein, W/2R in parentheses after "cos" is in radian unit, W represents an electrode width of the reed screen shaped electrode and R represents a radius of the surface acoustic wave circulation path 12a of the surface acoustic wave propagation substrate 12.

That is to say, an elasticity of the excitation/detection unit support 20 and that of the elastic deformation member 10 are set so as to obtain at least such a depth D of the depression of the elastic deformation member 18. However, when there is no possibility that the reed screen shaped electrode of the surface acoustic wave excitation/detection unit 16 is broken as described above by the depression of the elastic deformation member 18, the depth D can be larger.

Alternatively, it is possible to process in advance the outer surface of the contacting portion on which the reed screen shaped electrode of the surface acoustic wave excitation/detection unit 16 is supported, into a concave surface having the above-described depression in the elastic deformation member 10. In such a case, the outer surface of the elastic deformation member 10 is not substantially forced to be elastically deformed when the reed screen shaped electrode of the surface acoustic wave excitation/detection unit 16 is brought into contact with the surface acoustic wave circulation path 12a of the surface acoustic wave propagation substrate 12, and the possibility that the reed screen shaped electrode of the surface acoustic wave excitation/detection unit 16 is broken is substantially eliminated.

However, when the outer surface of the contacting portion of the elastic deformation member 10 is formed into a planar shape and shaping of the reed screen shaped electrode from the highly-conductive metal thin film such as the gold, the copper and the aluminum formed on such flat outer surface using photolithographic technique (photoengraving) or a maskless exposing device, a high-definition reed screen shaped electrode can be formed at a low cost. That is to say, a popular processing device such as an exposure device or an inkjet applicator for high-definition patterning is manufactured on the assumption that an object of the patterning is a flat surface.

It is widely known from the above-described International Publication No. WO 01/45255 A1, etc. that, when a surface acoustic wave having a width of a predetermined range and a predetermined wavelength is excited in the surface acoustic wave circulation path 12a having a predetermined radius in the extending direction of the surface acoustic wave circulation path 12a, such the surface acoustic wave can repeatedly circulates along the surface acoustic wave circulation path 12a without diffusing in a direction orthogonal to the extending direction.

While the reed screen electrode of the surface acoustic wave excitation/detection unit 16 is brought into contact with the surface acoustic wave circulation path 12a through the extended end portion 20b of the excitation/detection unit support 20 and the elastic deformation member 10 as described above, the known operation control unit makes the reed screen electrode detect the surface acoustic wave which circulates in the surface acoustic wave circulation path 12a.

The reed screen shaped electrode of the surface acoustic wave excitation/detection unit 16 which is brought into contact with the surface acoustic wave circulation path 12a by the excitation/detection unit support 20 through the elastic deformation member 18, reflects some of energy of the surface acoustic wave circulated in the surface acoustic wave circulation path 12a, and attenuates some of the surface acoustic wave.

The reed screen shaped electrode of the surface acoustic wave excitation/detection unit 16 can excite the surface acoustic wave in the surface acoustic wave circulation path 12a and allow the excited surface acoustic wave to propagate and circulate in the extending direction of the surface acoustic wave circulation path 12a even when the reed screen shaped electrode is arranged away from the surface acoustic wave circulation path 12a on the outer surface of the surface acoustic wave propagation substrate 12 with a predetermined distance or less (one-quarter or less of the wavelength of the surface acoustic wave excited in the surface acoustic wave circulation path 12a and allowed to circulate). Then, in this case, the reed screen shaped electrode of the surface acoustic wave excitation/detection unit 16 does not reflect the energy of the surface acoustic wave circulated in the surface acoustic wave circulation path 12a and does not attenuate the surface acoustic wave. However, forming the excitation/detection unit support which is capable of always stably arranging the reed screen shaped electrode of the surface acoustic wave excitation/detection unit 16 at a predetermined distance or less from the surface acoustic wave circulation path 12a on the outer surface of the surface acoustic wave propagation substrate 12, requires an advanced processing accuracy, and it is difficult to prepare a great number of spherical surface acoustic wave apparatuses configured as described above.

The reed screen shaped electrode of the surface acoustic wave excitation/detection unit 16 which is brought into contact with the surface acoustic wave circulation path 12a by the excitation/detection unit support 20 through the elastic deformation member 18 can not accurately detect a strength and phase of the surface acoustic wave which is excited in the surface acoustic wave circulation path 12a of the surface acoustic wave propagation substrate 12 and which is circulated in the surface acoustic wave circulation path 12a, in comparison with a case in which the reed screen shaped electrode of the surface acoustic wave excitation/detection unit 16 is arranged at the predetermined distance or less from the surface acoustic wave circulation path 12a on the outer surface of the surface acoustic wave propagation substrate 12. However, the reed screen shaped electrode of the surface acoustic wave excitation/detection unit 16 which is brought into contact with the surface acoustic wave circulation path 12a is smaller in a ratio of reflection and attenuation of the energy of the surface acoustic wave circulated in the surface acoustic wave circulation path 12a as compared with the reed screen shaped electrode of the surface acoustic wave excitation/detection unit 16 which is directly formed on the surface acoustic wave circulation path 12a on the outer surface of the surface acoustic wave propagation substrate 12, so that the reed screen shaped electrode of the surface acoustic wave excitation/detection unit 16 which is brought into contact with the surface acoustic wave circulation path 12a can detect more accurately the strength and phase of the surface acoustic wave circulated.

This is because a surface roughness of the outer surface of the metal thin film which forms the reed screen shaped electrode of the surface acoustic wave excitation/detection unit 16 is generally larger than a surface roughness of the outer surface of the surface acoustic wave propagation substrate 12 obtained by processing the piezoelectric crystal material, so that the reed screen shaped electrode of the surface acoustic wave excitation/detection unit 16 is in contact with the surface acoustic wave circulation path 12a on the outer surface of the surface acoustic wave propagation substrate 12 with infinite number of points microscopically.

Furthermore, the advanced processing accuracy required for forming the excitation/detection unit support which is capable of always stably arranging the reed screen shaped electrode of the surface acoustic wave excitation/detection unit 16 at the predetermined distance or less from the surface acoustic wave circulation path 12a on the outer surface of the surface acoustic wave propagation substrate 12 as described above is not required.

However, it is preferable that a surface area of the contacting portion with which the reed screen shaped electrode of the surface acoustic wave excitation/detection unit 16 is brought into contact with the surface acoustic wave circulation path 12a is smaller because the ratio of the reflection and attenuation of the energy of the surface acoustic wave becomes smaller.

For this purpose, in this embodiment, a contacting area decreasing process 26 for decreasing the contacting area of the contacting portion to the surface acoustic wave circulation path 12a is applied to the surface of the contacting portion of the reed screen shaped electrode of the surface acoustic wave excitation/detection unit 16 as well illustrated in FIG. 5. The contacting area decreasing process 26 includes forming concaves or projections at a plurality of positions on the surface of the contacting portion of the surface acoustic wave excitation/detection unit 16.

Figure 6B:
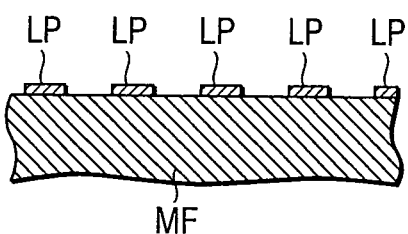
FIG. 6B is a schematic vertical cross-sectional view of FIG. 6A.
Figure 6C:
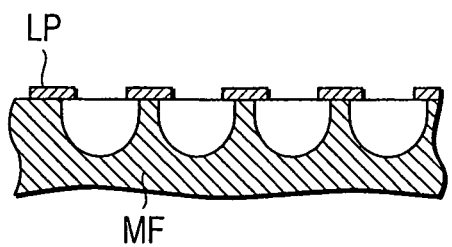
FIG. 6C is a schematic vertical cross-sectional view of a state in which the etching is progressed from the state shown in FIG. 6B and a plurality of concaves are formed on a surface of the metal thin film shown in FIG. 6A and being the basis of the surface acoustic wave excitation/detection unit.
Figure 6D:
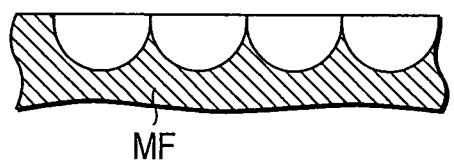
FIG. 6D is a schematic vertical cross-sectional view of the metal thin film which is the basis of the surface acoustic wave excitation/detection unit, after formation of the concaves by the etching process in FIG. 6C is finished and the pattern of the resist materials is removed.

A plurality of concaves of the contacting area decreasing process 26 is formed by etching, for example. In detail, as illustrated in FIGS. 6A and 6B, a plurality of minute resist patterns LP are attached to a metal thin film MF formed directly or indirectly through an electrically nonconductive material NC as described above for shaping the reed screen shaped electrode of the surface acoustic wave excitation/detection unit 16 (refer to FIG. 2) on the outer surface of the contacting portion of the elastic deformation member 18 which is the electrically nonconductive (refer to FIG. 2). Next, as illustrated in FIG. 6C, a known isotropic etching is performed to the metal thin film MF with the plurality of minute resist patterns LP. According to this, a plurality of concaves are formed on a plurality of positions on the outer surface of the metal thin film MF which is not coated with the plurality of minute resist patterns LP. Next, as illustrated in FIG. 6D, the plurality of minute resist patterns LP are removed from the outer surface of the metal thin film MF by a known method. Thereafter, the known isotropic etching can be performed again to the outer surface of the metal thin film MF for further decreasing an area of an apex (a portion which is brought into direct contact with the surface acoustic wave circulation path 12a) of each projection between the plurality of concaves on the outer surface of the metal thin film MF.

The plurality of concaves of the contacting area decreasing process 26 can also be obtained by applying known soft etching without attaching the plurality of minute resist patterns LP on the outer surface of the metal thin film MF which is formed directly or indirectly through the electrically nonconductive material NC as described above on the outer surface of the elastic deformation member 18 (refer to FIG. 2) to shape the reed screen shaped electrode of the surface acoustic wave excitation/detection unit 16 (refer to FIG. 2), and by generating etching spots thereon.

Figure 7:
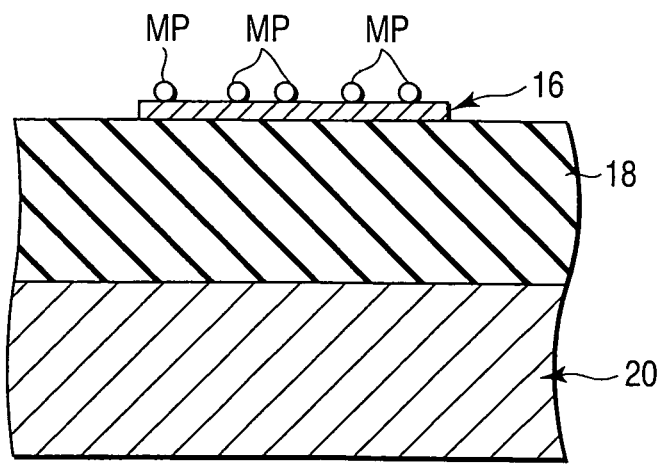
FIG. 7 is a schematic enlarged vertical cross-sectional view of a state in which a plurality of minute particles are applied on the surface of the surface acoustic wave excitation/detection unit to perform the contacting area decreasing process on the surface of the surface acoustic wave excitation/detection unit shown in FIG. 5.

The plurality of projections of the contacting area decreasing process 26 can be formed by for example attaching minute particles MP each of which has a radius of one-quarter or less of the period of arrangement P of the electrode branches 16c of the reed screen shaped electrode (refer to FIG. 3B) to the plurality of positions on the surface of the circulation path contacting portion of the reed screen shaped electrode of the surface acoustic wave excitation/detection unit 16, the reed screen shaped electrode being formed of the metal thin film formed directly or indirectly through the electrically nonconductive material NC as described above on the outer surface of the contacting portion of the elastic deformation member 18 (refer to FIG. 2) as illustrated in FIG. 7.

Second Embodiment

A spherical surface acoustic wave apparatus 30 according to a second embodiment of the present invention will be described with reference to FIGS. 8A to 8C of the appended drawings.

A part of structural components of the spherical surface acoustic wave apparatus 30 according to the second embodiment is identical to a part of the structural components of the spherical surface acoustic wave apparatus 10 according to the first embodiment of the present invention and described above with reference to FIGS. 1 to 7. Therefore, in the spherical surface acoustic wave apparatus 30 according to the second embodiment, the same structural components as those of the spherical surface acoustic wave apparatus 10 according to the first embodiment and described above are denoted by the same reference numerals denoting the same structural components of the spherical surface acoustic wave apparatus 10, and detailed descriptions thereof are omitted.

The spherical surface acoustic wave apparatus 30 according to the second embodiment differs from the spherical surface acoustic wave apparatus 10 according to the first embodiment in a configuration of a substrate support 32 which supports a region on the outer surface of the surface acoustic wave propagation substrate 12, the region excluding the surface acoustic wave circulation path 12a, and a configuration of an excitation/detection unit support 34 which supports an elastically deformable elastic deformation member 36 supporting the plurality of surface acoustic wave excitation/detection units 16, which brings the surface acoustic wave excitation/detection unit 16 into contact with the surface acoustic wave circulation path 12a on the outer surface of the surface acoustic wave propagation substrate 12 through the elastic deformation member 36, and which elastically deforms the elastic deformation member 36.

The substrate support 32 supports a plurality of surface acoustic wave propagation substrates 12 while a part of the surface acoustic wave circulation path 12a on the outer surface of each of the plurality of surface acoustic wave propagation substrates 12 is externally exposed from one surface of the substrate support 32, as illustrated well in FIG. 8A.

In this embodiment, the substrate support 32 has a flat plate shape and a plurality of predetermined supporting positions 32a have hole shapes penetrating in both flat surfaces of the substrate support 32. The surface acoustic wave propagation substrates 12 are supported in the supporting positions 32a after a direction of a crystal axis Z of each surface acoustic wave propagation substrate 12 is measured by a known measuring unit (not illustrated) at a measurement position and the measured surface acoustic wave propagation substrate 12 is conveyed from the measurement position to the predetermined supporting position 32a of the substrate support 32 while measured surface acoustic wave propagation substrate 12 is provisionally held by for example a known holding/conveying unit 36.

In detail, the surface acoustic wave propagation substrate 12 is supported in the predetermined supporting position 32a such that the crystal axis Z (C axis in the case of quartz) is directed in a predetermined direction, that is to say, the predetermined surface acoustic wave circulation path 12a on the outer surface of the surface acoustic wave propagation substrate 12 is directed in a predetermined circumferential position around the hole of the predetermined supporting position 32a. At that time, the predetermined surface acoustic wave circulation path 12a on the outer surface of the surface acoustic wave propagation substrate 12 is orthogonal to the both flat surfaces of the flat plate-shaped substrate support 32 at the predetermined circumferential position of the hole of the predetermined supporting position 32a.

The region on the outer surface of the surface acoustic wave propagation substrate 12 excluding the predetermined surface acoustic wave circulation path 12a is supported in the predetermined supporting position 32a, and the predetermined surface acoustic wave circulation path 12a is not brought into contact with the predetermined supporting position 32a. On a region of the predetermined supporting position 32a for supporting the region on the outer surface of the surface acoustic wave propagation substrate 12 excluding the predetermined surface acoustic wave circulation path 12a, a known fixing element such as an adhesive is provided. Therefore, the outer surface of the surface acoustic wave propagation substrate 12 supported in the predetermined supporting position 32a is fixed to the predetermined supporting position 32a with the above-described known fixing element. The above-described known fixing element includes a frictional engagement of the supporting region of the predetermined supporting position 32a with the region on the outer surface of the surface acoustic wave propagation substrate 12 excluding the predetermined surface acoustic wave circulation path 12a.

In the predetermined supporting position 32a of the substrate support 32, both end positions of the predetermined surface acoustic wave circulation path 12a in its radial direction on the outer surface of the surface acoustic wave propagation substrate 12 are exposed to an external space.

The excitation/detection unit support 34 of this embodiment is provided with the elastic deformation member 36 to be brought into contact with the part of the surface acoustic wave circulation path 12a on the outer surface of each of the plurality of surface acoustic wave propagation substrates 12 supported as described above in the plurality of predetermined supporting positions 32a of the substrate support 32 and to be elastically deformed as illustrated in FIGS. 8B and 8C, when the excitation/detection unit support 34 is detachably fixed to a predetermined position on the one surface of the substrate support 32. The elastic deformation member 36 may be formed of a material similar to that of an elastic deformation member 18 of the first embodiment described above.

As in the case of the first embodiment described above, the reed screen shaped electrodes of the surface acoustic wave excitation/detection units 16 are supported on outer surfaces of contacting portions of the elastic deformation member 36, each contacting portion of which being brought into contact with a part of the surface acoustic wave circulation path 12a on the outer surface of each of the plurality of surface acoustic wave propagation substrates 12 supported as described in the plurality of predetermined supporting positions 32a of the substrate support 32 of the elastic deformation member 36.

The reed screen shaped electrode of the surface acoustic wave excitation/detection unit 16 which is brought into contact with a part of the surface acoustic wave circulation path 12a on the outer surface of each of the plurality of surface acoustic wave propagation substrates 12 supported on the plurality of predetermined supporting positions 32a of the substrate support 32 as described above, through the elastic deformation member 36 of the excitation/detection unit support 34, makes a direction in which the plurality of teeth like electrode branches 16c (refer to FIGS. 3A and 3B) thereof are alternately arranged conform to the extending direction of the surface acoustic wave circulation path 12a (the direction along the annular line at which the crystal face around the crystal axis Z of the quartz intersects with the spherical outer surface of the surface acoustic wave propagation substrate 12 of the quartz in the embodiment) and makes an extending direction of each of the plurality of teeth like electrode branches 16c being preferably orthogonal to the extending direction of the surface acoustic wave circulation path 12a, as in the case of the first embodiment described above.

As a structure for detachably fixing the excitation/detection unit support 34 to the predetermined position on the one surface of the substrate support 32 as illustrated in FIGS. 8B and 8C, various known position fixing structures may be adopted. In this embodiment, the position fixing structure is provided by a combination of a plurality of positioning holes PH formed at a plurality of predetermined positions in the one surface of the substrate support 32 and a plurality of positioning projections PP formed at a plurality of predetermined positions on an outer surface of the excitation/detection unit support 34 so as to be inserted into and removed from the positioning holes PH.

It is also possible to form the plurality of positioning holes PH at the plurality of predetermined positions in the outer surface of the excitation/detection unit support 34 and to form the plurality of positioning projections PP at the plurality of predetermined positions on the one surface of the substrate support 32.

Third Embodiment

Next, a spherical surface acoustic wave apparatus 40 according to a third embodiment of the present invention will be described with reference to FIGS. 9 to 11.

The spherical surface acoustic wave apparatus 40 is provided with a known surface acoustic wave propagation substrate 42. The surface acoustic wave propagation substrate 42 can be formed by preparing a base material formed to include, on an outer surface thereof, a portion configured to be annular and continuous using at least a part of a spherical shape with a material which is not able to be excited to generate a surface acoustic wave, and by coating at least the annular portion on the outer surface of the base material with a material which is able to be excited to generate the surface acoustic wave. Alternatively, the surface acoustic wave propagation substrate 42 is formed to include, on the outer surface thereof, the portion configured to be annular and continuous using at least the part of the spherical shape with a material which is able to being excited to generate the surface acoustic wave.

In this embodiment, the surface acoustic wave propagation substrate 42 is formed of the material which is able to be excited to generate the surface acoustic wave into the spherical shape and includes, on the outer surface thereof, a surface acoustic wave circulation path 42a configured to be annular and continuous using at least a part of the spherical shape in which the surface acoustic wave can be excited and the excited surface acoustic wave can propagate and circulate in a continuous direction of the annular shape.

As the material capable of being excited to generate the surface acoustic wave, a piezoelectric crystal material such as quartz, lithium niobate ($LiNbO_3$), lithium tantalate ($LiTaO_3$), langasite ($La_3Ga_5SiO_{14}$) and a family thereof is used, for example. In this case, the portion configured to be annular and continuous using at least a part of the spherical shape is on a line at which a crystal face inherent to the piezoelectric crystal material intersects with the outer surface of the spherical shape of the surface acoustic wave propagation substrate 42, and the continuous direction of the annular shape is substantially an extending direction of the intersection line. For example, in the above-described various materials, the surface acoustic wave can propagate along the crystal face crystallographically referred to as a C axis, in general.

The surface acoustic wave propagation substrate 42 of the piezoelectric crystal material is generally formed into the spherical shape having a diameter of substantially 10 mm to substantially 1 mm in consideration of a manufacturing cost, and the diameter of the surface acoustic wave propagation substrate 42 according to this embodiment is 3.3 mm.

In this embodiment, the surface acoustic wave propagation substrate 42 is formed of spherical quartz. In the spherical quartz, a maximum outer circumferential line around a crystal axis Z, which corresponds to an equator on a spherical outer surface of the quartz when considering the spherical crystal as the earth and considering the crystal axis Z (C axis in the case of the quartz) as an axis of rotation of the earth, is a line at which the crystal face of the quartz intersects with the spherical outer surface of the quartz, and the surface acoustic wave propagation path 42a annularly extends at one time on the outer surface along the maximum outer circumference line.

The spherical surface acoustic wave apparatus 40 is provided with a surface acoustic wave excitation/detection unit 44 which excites and circulates the surface acoustic wave in the surface acoustic wave circulation path 42a on the outer surface of the surface acoustic wave propagation substrate 42 and which detects the surface acoustic wave circulated in the surface acoustic wave circulation path 42a.

In this embodiment, the surface acoustic wave excitation/detection unit 44 is provided on the surface acoustic wave circulation path 42a on the outer surface of the surface acoustic wave propagation substrate 42.

In this embodiment, the surface acoustic wave excitation/detection unit 44 is provided with a reed screen shaped electrode formed on the surface acoustic wave circulation path 12a. The reed screen shaped electrode is configured by combining a pair of comb-shaped terminals 44a and 44b such that a plurality of teeth like electrode branches 44c of one comb-shaped terminal 44a and a plurality of teeth like electrode branches 44c of another comb-shaped terminal 44b are alternately arranged as illustrated in FIG. 9. A direction in which the teeth like electrode branches 44c of the pair of comb-shaped terminals 44a and 44b of the reed screen shaped electrode are alternately arranged conforms to an annular extending direction of the surface acoustic wave circulation path 42a (in this embodiment, a direction along an annular line at which the crystal face around the crystal axis Z of the quartz intersects with the spherical outer surface of the surface acoustic wave propagation substrate 42 of the quartz). In the reed screen shaped electrode, an extending direction of each of the plurality of teeth like electrode branches 44c is preferably orthogonal to the annular extending direction of the surface acoustic wave circulation path 42a.

The reed screen shaped electrode can be formed by directly forming a highly-conductive metal thin film such as gold, copper and aluminum on the outer surface of the surface acoustic wave propagation substrate 42 and thereafter by shaping the metal thin film by for example photolithography (photoengraving).

The surface acoustic wave excitation/detection unit 44 is provided with first and second external connection terminals 44d and 44e arranged in both sides of the surface acoustic wave circulation path 42a on the outer surface of the surface acoustic wave propagation substrate 42. In this embodiment, the first and second external connection terminals 44d and 44e extend on the outer surface of the surface acoustic wave propagation substrate 42 from the pair of comb-shaped terminals 44a and 44b of the reed screen shaped electrode on the surface acoustic wave circulation path 42a corresponding to the equator when considering the surface acoustic wave propagation substrate 42 as the earth as described above to both positions located opposite to each other in a radial direction of the surface acoustic wave propagation substrate 42, the both positions corresponding to a north pole and south pole of the earth. The first and second external connection terminals 44d and 44e are formed integrally with the reed screen shaped electrode as described above.

The first and second external connection terminals 44d and 44e are electrically connected to a known operation control unit 50 for controlling an operation of the surface acoustic wave excitation/detection unit 44. While the region on the outer surface of the surface acoustic wave propagation substrate 42 excluding the surface acoustic wave circulation path 42a is supported (that is to say, while nothing is brought into contact with the surface acoustic wave circulation path 42a), when a high-frequency signal of a predetermined frequency is applied in a burst manner between the pair of comb-shaped terminals 44a and 44b by the operation control unit 50, a surface acoustic wave having a predetermined wavelength is excited in the surface acoustic wave circulation path 42a on the outer surface of the surface acoustic wave propagation substrate 42.

Herein, each of the predetermined frequency and the predetermined wavelength corresponds to a period of arrangement of the plurality of teeth like electrode branches 44c of the pair of comb-shaped terminals 44a and 44b. A width of the surface acoustic wave excited by the reed screen shaped electrode in the surface acoustic wave circulation path 42a is a distance (electrode width) with which adjacent two teeth like electrode branches 44c out of the plurality of teeth, like electrode branches 44c are opposed to each other.

It is widely known from the above-described International Publication No. WO 01/45255 A1, etc. that, when a surface acoustic wave having a width of a predetermined range and a predetermined wavelength is excited in the surface acoustic wave circulation path 42a having a predetermined radius in the extending direction of the surface acoustic wave circulation path 42a, such the surface acoustic wave can repeatedly circulates along the surface acoustic wave circulation path 42a without diffusing in a direction orthogonal to the extending direction.

The known operation control unit 50 can detect the surface acoustic wave which circulates in the surface acoustic wave circulation path 42a, by the reed screen shaped electrode of the surface acoustic wave excitation/detection unit 44 provided on the surface acoustic wave circulation path 42a.

In this embodiment, the reed screen shaped electrode of the surface acoustic wave excitation/detection unit 44 formed as described above on the surface acoustic wave circulation path 42a on the outer surface of the surface acoustic wave propagation substrate 42 attenuates propagation energy of the surface acoustic wave when the surface acoustic wave circulated in the surface acoustic wave circulation path 42a collides the reed screen shaped electrode, and decreases the number of circulations of the surface acoustic wave. However, an entire length of the reed screen shaped electrode in the extending direction of the surface acoustic wave circulation path 42a (that is to say, a length of arrangement of the plurality of teeth like electrode branches 44c in the direction in which the plurality of teeth like electrode branches 44c of the pair of comb-shaped terminals 44a and 44b of the reed screen shaped electrode are arranged) is much shorter than an annular extending length of the surface acoustic wave circulation path 42a, and an area with which the reed screen shaped electrode is brought into contact with the surface acoustic wave circulation path 42a is significantly smaller than an entire area of the surface acoustic wave circulation path 42a. Therefore, a ratio of the attenuation of the propagation energy when the surface acoustic wave circulating along the surface acoustic wave circulation path 42a collides with the reed screen shaped electrode is small, and the surface acoustic wave can perform significant multiple circulations for desired measurement.

The spherical surface acoustic wave apparatus 40 is further provided with a substrate supporting unit configured to support the surface acoustic wave propagation substrate 42.

In this embodiment, the substrate supporting unit is provided with a substrate support 46 including a substrate seat 46a on which the region of the outer surface of the surface acoustic wave propagation substrate 42 excluding the surface acoustic wave circulation path 42a is mounted.

In this embodiment, the substrate support 46 is formed of an electrically nonconductive material such as plastic or a glass-epoxy material, and may be formed of a wiring substrate generally referred as a printed wiring board. The substrate seat 46a is a concave formed in one surface of the substrate support 46 and has a shape and size substantially identical to those of the south pole corresponding portion on the outer surface of the surface acoustic wave propagation substrate 42, on the south pole corresponding portion the second external connection terminal 44e of the reed screen shaped electrode of the surface acoustic wave excitation/ detection unit 14 being arranged.

When the size and shape of the concave of the substrate seat 46a is not substantially identical to the size and shape of the south pole corresponding portion on the outer surface of the surface acoustic wave propagation substrate 42, the concave is locally brought into contact with the south pole corresponding portion on the outer surface of the surface acoustic wave propagation substrate 42. As a result, strong pressure is locally applied to the second external connection terminal 44e located on the south pole corresponding portion so that the second external connection terminal 44e may be broken.

A first terminal 46b is arranged on the substrate seat 46a, and the first terminal 46b is connected to the above-described known operation control unit 50 for controlling the operation of the surface acoustic wave excitation/detection unit 44. Therefore, when the south pole corresponding portion on the outer surface of the surface acoustic wave propagation substrate 42 is seated on the substrate seat 46a of the substrate support 46, the second external connection terminal 44e of the reed screen shaped electrode of the surface acoustic wave excitation/detection unit 44 is connected to the known operation control unit 50 through the first terminal 46b on the substrate seat 46a.

In this embodiment, the substrate supporting unit is further provided with a substrate elastic holder 48 which easily detachably fixes the surface acoustic wave propagation substrate 42 seated on the substrate seat 46a of the substrate support 46 to the substrate support 46 without being brought into contact with the surface acoustic wave circulation path 42a.

The substrate elastic holder 48 is formed of a material which exerts elastic resistance against bending, and has a portion 48a which is brought into contact with the region on the outer surface of the surface acoustic wave propagation substrate 42 mounted on the substrate seat 46a of the substrate support 46, the region on the outer surface excluding the surface acoustic wave circulation path 42a and being opposite to the substrate seat 46a of the substrate support 46. The substrate elastic holder 48 are pressed at both sides of the contacting portion 48a against the elastic resistance toward the substrate support 46, and end portions 48b of the both sides are easily detachably fixed to positions away from the substrate seat 46a on both sides of the substrate seat 46a on the substrate support 46.

In this embodiment, the portion of the region excluding the surface acoustic wave circulation path 42a on the outer surface of the surface acoustic wave propagation substrate 42 mounted on the substrate seat 46a of the substrate support 46, the portion being opposite to the substrate seat 46a of the substrate support 46 and being in contact with the substrate elastic holder 48, is a north pole corresponding portion on which the first external connection terminal 44d of the reed screen shaped electrode of the surface acoustic wave excitation/detection unit 44 is arranged.

The portion 48a of the substrate elastic holder 48, which is brought into contact with the north pole corresponding portion on the outer surface of the surface acoustic wave propagation substrate 42 mounted on the substrate seat 46a of the substrate support 46, is configured as a concave which accepts the north pole corresponding portion on the outer surface of the surface acoustic wave propagation substrate 42 and which is brought into line contact with or surface contact with the north pole corresponding portion. A shape and size of the concave is preferably substantially identical to a shape and size of the north pole corresponding portion on the outer surface of the surface acoustic wave propagation substrate 42 so as to brought into substantially surface contact with the north pole corresponding portion.

That is to say, the contacting portion 48a of the substrate elastic holder 48 is brought into contact with or adjacent to the first external connection terminal 44d on the north pole corresponding portion opposite to the substrate seat 46a of the substrate support 46 on the outer surface of the surface acoustic wave propagation substrate 42.

The substrate elastic holder 48 is provided with a conducting path 48c extending between the contacting portion 48a and a portion of at least one of the end portions 48b of the both sides of the contacting portion 48a, the at least one portion being detachably fixed to the substrate support 46. The conducting path 48c can be provided by forming the substrate elastic holder 48 of an electrically conductive material or can be provided by forming the substrate elastic holder 48 of the insulating material and by for example attaching a known electrically conductive material so as to extend as described above on the outer surface of the substrate elastic holder 48.

At the portions which are away from the substrate seat 46a in the both sides of the substrate seat 46a on the one surface of the substrate support 46 and which are detachably fixed to the end portions 48b of the both sides of the substrate elastic holder 48, second terminals 46c which are brought into contact with the conducting path 48c on the at least one of the end portions 48b of the both sides of the substrate elastic holder 48 are arranged, and each of the second terminals 46c is connected to the above-described known operation control unit 50 for controlling the operation of the surface acoustic wave excitation/detection unit 44.

By detachably fixing the end portions 48b of the both sides of the substrate elastic holder 48 to the positions away from the substrate seat 46a in the both sides of the substrate seat 46a on the one surface of the substrate support 16 while the substrate elastic holder 48 brings its contacting portion 48a into contact with the north pole corresponding portion on the outer surface of the surface acoustic wave propagation substrate 42 seated on the substrate seat 46a of the substrate support 46, the first external connection terminal 44d of the reed screen shaped electrode of the surface acoustic wave excitation/detection unit 44 is connected to the known operation control unit 50 through the conducting path 48c of the substrate elastic holder 48 and the second terminals 46c of the substrate support 46.

Generally, in an electronic circuit, one of a pair of electrodes is often functioned as a ground electrode. In the present invention, one of the first and second terminals 46b and 46c of the substrate support 46 to which the first and second external connection terminals 44d and 44e of the reed screen shaped electrode are connected can be functioned as the ground electrode, and this is not to make any problem and this is preferable to prevent noise.

In this embodiment, engagement concaves 46d are formed in the two positions on the one surface of the substrate support 46, the two positions being away from the substrate seat 46a on the both sides of the substrate seat 46a on the one surface of the substrate support 46 and being detachably fixed with the end portions 48b of the both sides of the substrate elastic holder 48 as described above. The end portions 48b of the both sides of the substrate elastic holder 48 are inserted into the engagement concaves 46d, and the end portions 48b of the both sides of the substrate elastic holder 48 are engaged therewith against the elastic resistance of the both sides. In this embodiment, the engagement concaves 46d are formed as penetrating holes in order to ease a forming thereof and to ease the insertions and engagements of the end portions 48b of the both sides of the substrate elastic holder 48 thereto. Each of the second terminals 46c is arranged at a portion on an inner peripheral surface of each the penetrating holes of the engagement concaves 46d, with that portion each of the end portions 48b of the both sides of the substrate elastic holder 48 being brought into contact and being frictionally engaged.

In this embodiment, the substrate elastic holder 48 is configured with a stainless plate which has a thickness of 30μ and which is a kind of an electrically conductive material, into a band plate shape extending straight between the above-described end portions 48b of the both sides as illustrated in FIGS. 10A and 10B.

FIG. 10B illustrates a side view of the substrate elastic holder 48 before the above-described end portions 48b of the both sides are being pressed against the elastic resistance thereof. Herein, it is also illustrated that a central portion of the band plate shaped elastic holder 48, which is the portion 48a brought into contact with the north pole corresponding portion on the outer surface of the surface acoustic wave propagation substrate 42 mounted on the substrate seat 46a of the substrate support 46, is configured as a concave having the size and shape substantially identical to those of the north pole corresponding portion on the outer surface of the surface acoustic wave propagation substrate 42 as described above.

When the size and shape of the concave of the contacting portion 48a at the central portion of the elastic holder 48 are not substantially identical to the shape and size of the north pole corresponding portion on the outer surface of the surface acoustic wave propagation substrate 42, the concave is locally brought into contact with the north pole corresponding portion on the outer surface of the surface acoustic wave propagation substrate 42. As a result, the strong pressure is locally applied to the first external connection terminal 44d which is located on the north pole corresponding portion so that the first external connection terminal 44d may be broken.

Such band plate-shaped substrate elastic holder 48 easily detachably fixes the surface acoustic wave propagation substrate 42 to the substrate support 46 in a following manner, after the south pole corresponding portion on the outer surface of the surface acoustic wave propagation substrate 42 seats on the substrate seat 46a of the substrate support 46 and the second external connection terminal 44e of the reed screen shaped electrode of the surface acoustic wave excitation/detection unit 44 arranged on the south pole corresponding portion is electrically connected to the first terminal 46b on the substrate seat 46a as indicated by an outlined arrow A in FIG. 10C.

After the south pole corresponding portion on the outer surface of the surface acoustic wave propagation substrate 42 is seated on the substrate seat 46a of the substrate support 46 as described above as indicated by the outlined arrow A in FIG. 10C, the both side end portions 48b of the band plate-shaped substrate elastic holder 48 illustrated in FIGS. 10A and 10B are pressed against the elastic resistance thereof toward the substrate support 46 by a pair of pressing members PM into a substantially inverted U shape as illustrated in FIG. 10C while the central portion thereof is supported by a central portion support CS above the north pole corresponding portion on the outer surface of the surface acoustic wave propagation substrate 42.

Next, the pair of pressing members PM together with the central portion support CS is lowered to insert the both side end portions 18b of the inverted U shaped substrate elastic holder 48 into the engagement concaves 46d on the both sides of the substrate seat 46a of the substrate support 46 as indicated by arrows B in FIG. 10C.

Next, the central portion support CS is separated from the central portion of the substrate elastic holder 48 just before the concave of the contacting portion 48a on the central portion of the substrate elastic holder 48 is covered on the north pole corresponding portion on the outer surface of the surface acoustic wave propagation substrate 42, and further, the concave of the contacting portion 48a on the central portion of the substrate elastic holder 48 is covered on the north pole corresponding portion on the outer surface of the surface acoustic wave propagation substrate 12 and is brought into line contact or surface contact with the north pole corresponding portion. As a result, the contacting portion 48a on the central portion of the substrate elastic holder 48 is electrically connected to the first external connection terminal 44d of the reed screen shaped electrode of the surface acoustic wave excitation/detection unit 44 arranged on the north pole corresponding portion on the outer surface of the surface acoustic wave propagation substrate 12.

Next, the pair of the pressing members PM is separated from the end portions 48b of the both sides of the substrate elastic holder 48 as indicated by an outlined arrow C in FIG. 10D. As a result, the both side end portions 48b of the substrate elastic holder 48 develop to be separated from each other as indicated by an arrow E in FIG. 10D with an elastic force thereof, and are brought into contact with the inner peripheral surfaces of the engagement concaves 46d on the both sides of the substrate seat 46a of the substrate support 46 to be frictionally engaged with the inner peripheral surfaces of the engagement concaves 46d. At that time, the conducting paths 48c of the substrate elastic holder 48 are electrically connected to the second terminals 46c on the inner peripheral surfaces of the engagement concaves 46d on the both sides of the substrate seat 46a of the substrate support 46.

The substrate elastic holder 48 which frictionally engages the both side end portions 48b with the inner peripheral surfaces of the engagement concaves 46d on the both sides of the substrate seat 46a of the substrate support 46 presses the north pole corresponding portion on the outer surface of the surface acoustic wave propagation substrate 42 toward the substrate seat 46a of the substrate support 46 through the concave of the contacting portion 48a on the central portion by the elastic force generated therein, and then presses the south pole corresponding portion on the outer surface of the surface acoustic wave propagation substrate 42 on the substrate seat 46a of the substrate support 46.

As a result, the substrate elastic holder 48 easily detachably fixes the surface acoustic wave propagation substrate 42 on the substrate seat 46a of the substrate support 46. Although the substrate elastic holder 48 has a simple structure, the substrate elastic holder 48 can support the surface acoustic wave propagation substrate 42 on the substrate seat 46a of the substrate support 46 with nothing attached to the surface acoustic wave circulation path 42a of the surface acoustic wave propagation substrate 42 and also can replace the surface acoustic wave propagation substrate 42 with new one having a new sensitive film on the surface acoustic wave circulation path 42a, surely, easily and quickly.

Further, the electrical connection of the second external connection terminal 44e of the reed screen shaped electrode of the surface acoustic wave excitation/detection unit 44 arranged on the south pole corresponding portion on the outer surface of the surface acoustic wave propagation substrate 42 to the first terminal 46b arranged on the substrate seat 46a of the substrate support 46, and the electrical connection of the first external connection terminal 44d of the reed screen shaped electrode of the surface acoustic wave excitation/detection unit 44 arranged on the north pole corresponding portion on the outer surface of the surface acoustic wave propagation substrate 42 to the second terminals 46c on the inner peripheral surfaces of the engagement concaves 46d on the both sides of the substrate seat 46a of the substrate support 46 through the contacting portion 48a on the central portion of the substrate elastic holder 48 and the conducting paths 48c on the both sides thereof, are ensured.

In order to surely keep contact of the both side ends 48b of the substrate elastic holder 48 with the inner peripheral surfaces of the engagement concaves 46d on the both sides of the substrate seat 46a of the substrate support 46 and to keep frictional engagements therewith (that is to say, in order to surely fix the surface acoustic wave propagation substrate 42 on the substrate seat 46a of the substrate support 46 by the substrate elastic holder 48), it is necessary to satisfy following conditions.

That is to say, as illustrated in FIG. 11, while the surface acoustic wave propagation substrate 42 is seated on the substrate seat 46a of the substrate support 46 and first and second two straight lines FL and SL are determined as follows, an angle α between the first straight line FL and the second straight line SL must be 90 degrees or smaller. And, the first straight line FL connects a first contact point FP, at which the contacting portion 48a on the central portion of the substrate elastic holder 48 is brought into contact with the portion of the outer surface of the surface acoustic wave propagation substrate 42, the portion being opposite side of the substrate seat 46a of the substrate support 46, with a second contact point SP, at which each of the both side end portions 48b of the substrate elastic holder 48 is first brought into contact with a corresponding engagement concave 46d of the substrate support 46. The second straight line SL connects the second contact point SP and a third contact point TP, at which the outer surface of the surface acoustic wave propagation substrate 42 is brought into contact with the substrate seat 46a of the substrate support 46 on a side of the second contact point SP.

If the angle α is larger than 90 degrees, it is difficult to surely and stably fix the substrate elastic holder 48 to the substrate support 46 in a dynamics view point regarding the frictional engagement of the both side end portions 48b of the substrate elastic holder 48 with the inner peripheral surfaces of the two engagement concaves 46d of the substrate support 46. The angle α is preferably set to be 70 degrees or smaller in order to further ensure the above-described fixing by the above-described frictional engagement using the elastic force of the both side end portions 48d of the substrate elastic holder 48 while vertical vibration is applied.

Modification of Third Embodiment

Next, a modification of a spherical surface acoustic wave apparatus 40 according to the third embodiment of the present invention will be described with reference to FIGS. 12A and 12B.

A spherical surface acoustic wave apparatus 40' according to the modification differs from the spherical surface acoustic wave apparatus 40 according to the third embodiment described above with reference to FIGS. 9 to 11 in followings, one of which is a structure of each of a substrate support 46' and substrate elastic holder 48' provided in a substrate supporting unit configured to support the surface acoustic wave propagation substrate 42, and the other of which is that a second terminal 46'c for the first external connection terminal 44d of the reed screen shaped electrode of the surface acoustic wave excitation/detection unit 44 of the surface acoustic wave propagation substrate 42 is provided not on the substrate support 46' but on the substrate elastic holder 48'.

The same structural components of the spherical surface acoustic wave apparatus 40' according to the modification as those of the spherical surface acoustic wave apparatus 40 according to the first embodiment are denoted by the same reference numerals denoting those of the spherical surface acoustic wave apparatus 40, and detailed descriptions thereof are omitted.

In the spherical surface acoustic wave apparatus 40' according to the modification, as illustrated in FIG. 12A, the substrate support 46' has an angular U shape, and extended end portions 46'f of a pair of side walls 46'e thereof are bent so as to be away from each other in a direction orthogonal to an extending direction of the pair of side walls 46'e. A substrate seat 46a is provided on a wall 46'g of a central portion of the substrate support 46' having the angular U shape, and the portion (the south pole corresponding portion) which is the region on the outer surface of the surface acoustic wave propagation substrate 42 excluding the surface acoustic wave circulation path 42a and on which the second external connection terminal 44e of the reed screen shaped electrode of the surface acoustic wave excitation/detection unit 44 is arranged, is seated on the substrate seat 46a.

Also in this modification, the substrate seat 46a is configured with a concave having a size and shape substantially identical to the size and shape of the portion (the south pole corresponding portion) which is the region on the outer surface of the surface acoustic wave propagation substrate 42 excluding the surface acoustic wave circulation path 42a and on which the second external connection terminal 44e of the reed screen shaped electrode of the surface acoustic wave excitation/detection unit 44 is arranged. The first terminal 46b connected to the operation control unit 50 illustrated in FIG. 9 is arranged on the substrate seat 46a. The substrate support 46' is formed of an electrically nonconductive material such as plastic, a glass epoxy material or a wiring substrate generally referred as a printed wiring board or is configured by coating a conductor including metal such as a stainless material with an electrically nonconductive material such as plastic, and the first terminal 46b is formed on a surface of such substrate support 46' by a known terminal forming process.

A width between the pair of side walls 46'e of the substrate support 46' is larger than a diameter of the surface acoustic wave circulation path 42a on the outer surface of the surface acoustic wave propagation substrate 42. Therefore, the pair of side walls 46'e are never brought into contact with the surface acoustic wave circulation path 42a on the outer surface of the surface acoustic wave propagation substrate 42 while the surface acoustic wave propagation substrate 42 is seated on the substrate seat 46a of the wall 46'g on the central portion of the substrate support 46' as described above.

An extending length of each of the pair of side walls 46'e from the wall 46' of the central portion to the extended end portion 46'f is shorter than the diameter of the outer surface of the surface acoustic wave propagation substrate 42.

Both end portions of a plate-shaped substrate elastic holder 48' which exerts elastic resistance against bending, are detachably fixed to ends of the extended end portions 46'f of the pair of side walls 16'e located on both sides of the substrate seat 46a of the wall 46'g of the central portion of the substrate support 46'. In this modification, the both end portions of the plate-shaped substrate elastic holder 48' are detachably engaged with and sandwiched between snap engagement claws 46'h formed on the ends of the pair of extended end portions 46'f. The substrate elastic holder 48' sandwiched in this manner blocks an opening between the extended end portions 46'f of the pair of side walls 46'e of the substrate support 46'. In this state, while the surface acoustic wave propagation substrate 42 is seated on the substrate seat 46a of the substrate support 46, the central portion of the plate-shaped substrate elastic holder 48' is brought into contact with the portion on the outer surface of the surface acoustic wave propagation substrate 42 excluding the surface acoustic wave circulation path 42a and located opposite to the substrate seat 46a of the substrate support 46'.

Since the both end portions of the plate-shaped substrate elastic holder 48' are engaged with the snap engagement claws 46'h of the extended end portions 46'f of the pair of side walls 46'e of the substrate support 46', both sides of contacting portions 48a on the substrate elastic holder 48' are pressed against their elastic resistance toward the substrate seat 46a of the substrate support 46'. With an elastic force generated by this pressing, the central portion of the plate-shaped substrate elastic holder 48' presses the surface acoustic wave propagation substrate 42 toward the substrate seat 46a of the substrate support 46' and elastically sandwiches the surface acoustic wave propagation substrate 42 in cooperation with the substrate seat 46a.

As illustrated in FIG. 12B, the contacting portion 48a on the central portion of the substrate elastic holder 48' is configured with a concave having a size and shape substantially identical to the size and shape of the portion (the north pole corresponding portion) in the region on the outer surface of the surface acoustic wave propagation substrate 42 excluding the surface acoustic wave circulation path 42a and located opposite to the substrate seat 46a of the substrate support 46'.

The first external connection terminal 44d of the reed screen shaped electrode of the surface acoustic wave excitation/detection unit 44 is arranged on the portion (the north pole corresponding portion) on the outer surface of the surface acoustic wave propagation substrate 42 which is brought into contact with the contacting portion 48a of the substrate elastic holder 48', and a second terminal 46'c to be connected to the operation control unit 50 illustrated in FIG. 9 is arranged on the contacting portion 48a of the substrate elastic holder 48'.

The substrate elastic holder 48' is formed of an electrically nonconductive material such as plastic, glass epoxy material and a wiring substrate generally referred as a printed wiring board, which exerts elastic resistance against bending or is configured by coating an electrical conducting material including metal such as stainless material with an electrically nonconductive material such as plastic, and the second terminal 46'c is formed on a surface of such substrate elastic holder 48' by the known terminal forming process.

The first terminal 46b of the substrate support 46' and the second terminal 46'c of the substrate elastic holder 48' are connected to the known operation control unit 50 for controlling the operation of the surface acoustic wave excitation/detection unit 44, as described above with reference to FIG. 9.

Generally in the electronic circuit, one of a pair of electrodes is often made a ground electrode. Therefore, in the present invention also, one of the first terminal 46b of the substrate support 46' and the second terminal 46'c of the substrate elastic holder 48', to both of which the first and second external connection terminals 44d and 44e of the reed screen shaped electrode of the surface acoustic wave excitation/detection unit 44 of the surface acoustic wave propagation substrate 42 are connected, may be connected to the ground, and it dose not cause any problem and it is preferable to prevent noise.

Fourth Embodiment

Next, a spherical surface acoustic wave apparatus 60 according to a fourth embodiment of the present invention will be described with reference to FIGS. 13A and 13B.

The spherical surface acoustic wave apparatus 60 according to the fourth embodiment uses the surface acoustic wave propagation substrate 42 which is identical to the surface acoustic wave propagation substrate 42 used in the spherical surface acoustic wave apparatus 40 according to the third embodiment of the present invention and described above with reference to FIGS. 9 to 11. That is to say, the surface acoustic wave propagation substrate 42 includes, on the outer surface thereof, the surface acoustic wave circulation path 42a configured to be annular and continuous using at least the part of the spherical shape and being able to be excited to generate the surface acoustic wave, and the excited surface acoustic wave can propagate and circulate in the continuous direction of the annular shape. However, the surface acoustic wave circulation path 42a of the surface acoustic wave propagation substrate 42 used in the spherical surface acoustic wave apparatus 60 according to the fourth embodiment is not provided with the surface acoustic wave excitation/detection unit 44 provided on the surface acoustic wave circulation path 42a in the surface acoustic wave propagation substrate 42 used in the spherical surface acoustic wave apparatus 40 according to the third embodiment.

The spherical surface acoustic wave apparatus 60 according to the fourth embodiment is provided with a substrate supporting unit configured to support the surface acoustic wave propagation substrate 42. The substrate supporting unit of this embodiment is provided with a substrate support 62 including a substrate seat 62a on which the region on the outer surface of the surface acoustic wave propagation substrate 42 excluding the surface acoustic wave circulation path 42a is mounted. The substrate support 62 is formed of an electrically nonconductive material such as plastic or a glass epoxy material, and may be formed of a wiring substrate generally referred as a printed wiring board.

The substrate seat 62a is configured with a concave on which a region on the outer surface of the surface acoustic wave propagation substrate 42, the region including the surface acoustic wave circulation path 42a, is seated. The concave has a size and shape substantially identical to the size and shape of the region on the outer surface of the surface acoustic wave propagation substrate 42 seated thereon, and is brought into line contact or surface contact with the region on the outer surface of the surface acoustic wave propagation substrate 42 seated thereon.

In an inner surface of the concave of the substrate seat 62a, a portion 62b corresponding to the surface acoustic wave circulation path 42a included in the region on the outer surface of the surface acoustic wave propagation substrate 42 seated thereon is removed. As a result, portions on both sides of the surface acoustic wave circulation path 42a in the region including the surface acoustic wave circulation path 42a on the outer surface of the surface acoustic wave propagation substrate 42 (that is to say, the portions excluding the surface acoustic wave circulation path 42a on the outer surface) are mounted on the inner surface of the concave of the substrate seat 62a.

The surface acoustic wave circulation path 42a of the surface acoustic wave propagation substrate 42 mounted on the concave of the substrate seat 62a of the substrate support 62 is directed in a direction orthogonal to one surface of the substrate support 62 on which the concave of the substrate seat 62a is formed, and is directed in a predetermined circumferential position around the substrate seat 62a on the one surface.

The substrate supporting unit of the spherical surface acoustic wave apparatus 60 according to the fourth embodiment is further provided with a substrate elastic holder 64 for easily detachably holding the surface acoustic wave propagation substrate 42 mounted on the substrate seat 62a of the substrate support 62. The substrate elastic holder 64 exerts elastic resistance against bending and includes a portion 64a which is brought into contact with a position of the surface acoustic wave circulation path 42a on the outer surface of the surface acoustic wave propagation substrate 42 mounted on the substrate seat 62a of the substrate support 62, the position being opposed to the substrate seat 62a of the substrate support 62. Furthermore, both sides of the contacting portion 64a of the substrate elastic holder 64 are pressed against their elastic resistances toward the substrate support 62, and end portions 64b on the both sides are detachably fixed against the elastic resistances to positions away from the substrate seat 62a on both sides of the substrate seat 62a in the substrate support 62.

A surface acoustic wave excitation/detection unit 66 is provided on the contacting portion 64a of the substrate elastic holder 64, and the surface acoustic wave excitation/detection unit 66 is for exciting and circulating the surface acoustic wave in the surface acoustic wave circulation path 42a on the outer surface of the surface acoustic wave propagation substrate 42 and for detecting the circulated surface acoustic wave.

The surface acoustic wave excitation/detection unit 66 is provided with first and second external connection terminals 66a and 66b which extend toward the both side end portions 64b of the substrate elastic holder 64.

The substrate support 62 is provided with first and second terminals 62c and 62d at its positions to which the both side end portions 64b of the substrate elastic holder 64 are detachably fixed, and the first and second terminals 62c and 62d can be brought into contact with the first and second external connection terminals 66a and 66b on the both side end portions 64b of the substrate elastic holder 64. The first and second terminals 62c and 62d are connected to the known operation control unit 50 for controlling operation of the surface acoustic wave excitation/detection unit 66. The known operation control unit 50 is identical to that used for the surface acoustic wave excitation/detection unit 44 of the surface acoustic wave propagation substrate 42 in the spherical surface acoustic wave apparatus 40 according to the third embodiment and described above with reference to FIGS. 9 to 11.

Therefore, as in the case of the spherical surface acoustic wave apparatus 40 according to the third embodiment and described above, one of the first and second terminals 62c and 62d of the substrate support 62 to which the first and second external connection terminals 66a and 66b of the reed screen shaped electrode are connected may be connected to the ground, and this does not cause any problem and is preferable to prevent noise.

In this embodiment, the substrate elastic holder 64 is an electrically nonconductive material having elasticity and having a thickness of 100μ, and is configured into a band plate shape extending straight between the both side end portions 64b as well illustrated in FIG. 13A. In this embodiment, the surface acoustic wave excitation/detection unit 66 and the first and second external connection terminals 66a and 66b are shaped by performing photolithography (photoengraving), for example, to a metal thin film having excellent electrical conductivity such as gold, copper and aluminum and attached to the outer surface of the substrate elastic holder 64.

The portion 64a of the substrate elastic holder 64, which is brought into contact with the portion of the outer surface of the surface acoustic wave propagation substrate 42 mounted on the substrate seat 62a of the substrate support 62, the portion being located to opposite to the substrate seat 62a of the substrate support 62, is configured as a concave to accept the corresponding portion on the outer surface of the surface acoustic wave propagation substrate 42. The concave has a size and shape substantially identical to the size and shape of the corresponding portion on the outer surface of the surface acoustic wave propagation substrate 42, and is brought into surface contact with the corresponding portion.

Since the contacting portion 64a on a central portion of the substrate elastic holder 64 is brought into surface contact with the corresponding portion on the outer surface of the surface acoustic wave propagation substrate 42, the surface acoustic wave excitation/detection unit 66 provided on the contacting portion 64a is brought into surface contact with the surface acoustic wave circulation path 42a on the corresponding portion on the outer surface of the surface acoustic wave propagation substrate 42.

In this embodiment, the surface acoustic wave excitation/detection unit 66 is configured with the reed screen shaped electrode identical to that configuring the surface acoustic wave excitation/detection unit 44 in the spherical surface acoustic wave apparatus 40 of the third embodiment of the present invention described above with reference to FIGS. 9 to 11.

That is to say, the surface acoustic wave excitation/detection unit 66 is configured by combining a pair of comb-shaped terminals 66c and 66d such that a plurality of teeth like electrode branches 66e are alternately arranged.

The reed screen shaped electrode of the surface acoustic wave excitation/detection unit 66 is arranged on the contacting portion 64a on the central portion of the substrate elastic holder 64 so as to be arranged in a following manner with respect to the surface acoustic wave circulation path 62a, when the contacting portion 64a on the central portion of the substrate elastic holder 64 is brought into surface contact with the surface acoustic wave circulation path 42a at the portion of the outer surface of the surface acoustic wave propagation substrate 42, the portion being located to opposite to the substrate seat 62a of the substrate support 62, and the both side end portions 64b of the substrate elastic holder 64 are fixed to the both sides of the substrate seat 62a of the substrate support 62 as illustrated in FIG. 13B.

That is to say, a direction in which the plurality of teeth like electrode branches 66e of the pair of comb-shaped terminals 66c and 66d of the reed screen shaped electrode are alternately arranged conforms to an annularly extending direction of the surface acoustic wave circulation path 62a (in this embodiment, the direction along the annular line on the spherical outer surface of the surface acoustic wave propagation substrate 42 of quartz at which the crystal face around the crystal axis Z of the quartz intersects with the spherical outer surface), and an extending direction of each of the plurality of teeth like electrode branches 66e is preferably orthogonal to the annularly extending direction of the surface acoustic wave circulation path 42a.

The pair of comb-shaped terminals 66c and 66d of the reed screen shaped electrode are electrically connected to the known operation control unit 50 for controlling the operation of the surface acoustic wave excitation/detection unit 44 through the first and second external connection terminals 66a and 66b and the first and second terminals 62c and 62d of the substrate support 62. Thus, when a high-frequency signal of a predetermined frequency is applied in a burst manner to the pair of comb-shaped terminals 66c and 66d by the known operation control unit 50, the reed screen shaped electrode can excite a surface acoustic wave having a predetermined wavelength in the surface acoustic wave circulation path 42a on the outer surface of the surface acoustic wave propagation substrate 42. Herein, each of the predetermined frequency and the predetermined wavelength corresponds to a period of arrangement of the plurality of teeth like electrode branches 66e of the pair of comb-shaped terminals 66c and 66d of the reed screen shaped electrode.

A width of the surface acoustic wave excited by the reed screen shaped electrode in the surface acoustic wave circulation path 62a is a distance (electrode width) with which two adjacent teeth like electrode branches 66e out of the plurality of teeth like electrode branches 66e of the pair of comb-shaped terminals 66c and 66d of the reed screen shaped electrode are opposed to each other.

It is known from the above-described International Publication No. WO 01/45255 A1, etc. that, when the surface acoustic wave having the width of the predetermined range and the predetermined wavelength is excited in the surface acoustic wave circulation path 42a having the predetermined radius to move in the extending direction of the surface acoustic wave circulation path 42a, such surface acoustic wave can repeatedly circulate in the surface acoustic wave circulation path 42a in the extending direction without diffusing in the direction orthogonal to the extending direction.

The known operation control unit 60 can detect the surface acoustic wave which circulates in the surface acoustic wave circulation path 42a, by the reed screen shaped electrode of the surface acoustic wave excitation/detection unit 66 provided on the surface acoustic wave circulation path 42a.

In this embodiment, the reed screen shaped electrode of the surface acoustic wave excitation/detection unit 66 formed as described above attenuates propagation energy of the circulated surface acoustic wave when the surface acoustic wave which circulates in the surface acoustic wave circulation path 42a collides with the reed shaped electrode, and decrease the number of circulations of the surface acoustic wave. However, an entire length of the reed screen shaped electrode in the extending direction of the surface acoustic wave circulation path 42a (that is to say, a length of arrangement of the plurality of teeth like electrode branches 66e in the direction in which the plurality of teeth like electrode branches 66e of the pair of comb-shaped terminals 66c and 66d of the reed screen shaped electrode are arranged) is much shorter than the annular extending length of the surface acoustic wave circulation path 42a, and a contacting area of the reed screen shaped electrode with the surface acoustic wave circulation path 42a is significantly smaller than an entire area of the surface acoustic wave circulation path 42a. Therefore, a ratio of the attenuation in the propagation energy of the circulated surface acoustic wave when the circulated surface acoustic wave collides with the reed shaped electrode, is small, and the surface acoustic wave can perform significant multiple circulations for desired measurement.

By the way, by hollowing a part other than the plurality of the teeth like electrode branches 66e of the reed screen shaped electrode than the plurality of teeth like electrode branches 66e on the contacting portion 64a on the central portion of the substrate elastic holder 64 on which the reed screen shaped electrode of the surface acoustic wave excitation/detection unit 66 is formed, it is possible to prevent the hollowed part other than the plurality of teeth like electrode branches 66e of the reed screen shaped electrode from being brought into contact with the surface acoustic wave circulation path 42a. As a result, the ratio of the attenuation in the propagation energy of the surface acoustic wave in the surface acoustic wave circulation path 42a can be further decreased.

A reason for using the electrically nonconductive material as the substrate elastic holder 64 in this embodiment is as follows. That is to say, if the substrate elastic holder 64 is formed of a conductive material and the surface of which is coated with an electrically insulating film, it is highly possible that the pair of comb-shaped terminals 66c and 66d of the reed screen shaped electrode is short circuited with each other through the conductive material coated with the thin electrically insulating film in the substrate elastic holder 64 when the high-frequency signal for exciting the surface acoustic wave is applied to the reed screen shaped electrode of the surface acoustic wave excitation/detection unit 66 formed on the surface of the substrate elastic holder 64.

Alternatively, as far as the pair of comb-shaped terminals 66c and 66d of the reed screen shaped electrode can not be short circuited with each other, the substrate elastic holder 64 can be formed of metal such as stainless having elasticity and coated with the electrically nonconductive material. For example, it may be possible that an entire substrate elastic holder 64 is formed of electrically conductive material such as metal and only the contacting portion 64a (in this embodiment, the concave on which the reed screen shaped electrode of the surface acoustic wave excitation/detection unit 66 is arranged) on the central portion of the substrate elastic holder 64 and the vicinity thereof are coated with material preventing the above-described short-circuit.

The substrate elastic holder 64 is preferably configured with more flexible plastic as far as this exerts necessary elastic resistance against bending. Such substrate elastic holder 64 can further stably hold the outer surface of the surface acoustic wave propagation substrate 42 with more improved contact with the outer surface of the surface acoustic wave propagation substrate 42. Alternatively, by forming an electrically insulating film which is more flexible than the plastic configuring the substrate elastic holder 64, only on the contacting portion 64*a* (that is to say, the concave on which the reed screen shaped electrode of the surface acoustic wave excitation/detection unit 66 is arranged) on the central portion of the substrate elastic holder 64, the contact of the contacting portion 64*a* on the central portion of the substrate elastic holder 64 with the outer surface of the surface acoustic wave propagation substrate 42 can be improved and the outer surface of the surface acoustic wave propagation substrate 42 can be more stably held.

In this embodiment, while the contacting portion 64*a* of the substrate elastic holder 64 is in contact with the portion of the surface acoustic wave circulation path 42*a* on the outer surface of the surface acoustic wave propagation substrate 42 seated on the substrate seat 62*a* of the substrate support 62, the portion being located to opposite to the substrate seat 62*a*, the both side end portions 64*b* of the substrate elastic holder 64 are detachably fixed to the positions away from the substrate seat 62*a* on the both sides of the substrate seat 62*a* on the one surface of the substrate support 62.

Engagement convex portions 62*e* are formed in the one surface of the substrate support 62 at the positions away from the substrate seat 62*a* on the both sides of the substrate seat 62*a* on the one surface of the substrate support 62. When the both side end portions 64*b* of the substrate elastic holder 64 are inserted to the engagement convex portions 62*e*, the substrate elastic holder 64 is bent around the contacting portion 64*a* as a center and generates the elastic resistance. As a result, frictional resistance is generated between the both side end portions 64*b* of the substrate elastic holder 64 and the inner surfaces of the engagement convex portions 62*e* due to the elastic resistance of the substrate elastic holder 64, and the both side end portions 64*b* of the substrate elastic holder 64 engage with the engagement convex portions 62*a* against the elastic resistance of the substrate elastic holder 64.

The engagement convex portions 62*e* of this embodiment are formed as penetrating holes to form the engagement convex portions 62*e* easily and to ease the insertions of the both side end portions 64*b* of the substrate elastic holder 64 thereto. The first and second terminals 62*c* and 62*d* are arranged on portions of the inner surfaces of the penetrating holes of the two engagement convex portions 62*e*, with the portions of which the both side end portions 64*b* of the substrate elastic holder 64 are brought into contact and frictionally engaged.

The band plate-shaped substrate elastic holder 64 which extends straight as illustrated in FIG. 13A before the both side end portions 64*b* are pressed against the elastic resistance, is detachably fixed at its both side end portions 64*b* to the two engagement convex portions 62*e* of the substrate support 62 as in the case in which the both end portions 48*b* of the band plate-shaped substrate elastic holder 48 of the spherical surface acoustic wave apparatus 40 according to the first embodiment are detachably fixed to the two engagement convex portions 46*d* of the substrate support 46 as illustrated in FIGS. 10A to 10D.

That is to say, after the portion excluding the surface acoustic wave circulation path 42*a* on the outer surface of the surface acoustic wave propagation substrate 42 (that is to say, the portions on the both sides of the surface acoustic wave circulation path 42*a*) is seated on the substrate seat 62*a* of the substrate support 62 as indicated by the outlined arrow A in FIG. 10C, and then the surface acoustic wave propagation substrate 62 is easily detachably fixed to the substrate seat 62*a* in a following manner.

The both side end portions 64*b* of the band plate-shaped straight substrate elastic holder 64 as illustrated in FIG. 13A are pressed against the elastic resistance by a pair of pressing members PM toward the substrate support 62 with the both side end portions 64*b* being directed to the substrate support 62, into a substantially inverted U shape while the central portion thereof is supported by a central portion support CS as illustrated in FIG. 10C above the portion located opposite to the substrate seat 62*a* on the surface acoustic wave circulation path 42*a* on the outer surface of the surface acoustic wave propagation substrate 42.

Next, in this state, the pair of pressing members PM together with the central portion support CS is lowered, and the both side end portions 64*b* of the substrate elastic holder 64 are inserted into the engagement convex portions 62*e* on the both sides of the substrate seat 62*a* of the substrate support 62 as indicated by arrows B in FIG. 10C.

Next, the central portion support CS is separated from the central portion just before the concave of the contacting portion 64*a* on the central portion of the substrate elastic holder 64 is covered on the portion of the surface acoustic wave circulation path 42*a* on the outer surface of the surface acoustic wave propagation substrate 42, the portion being located opposite to the substrate seat 62*a*. Further, after the concave of the contacting portion 64*a* on the central portion of the substrate elastic holder 64 is covered on the portion of the surface acoustic wave circulation path 42*a* on the outer surface of the surface acoustic wave propagation substrate 42, the portion being located opposite to the substrate seat 62*a*, and is brought into surface contact with the above described opposite portion of the surface acoustic wave circulation path 42*a*, the pair of pressing members PM are separated from the both side end portions 64*b* of the substrate elastic holder 64 as indicated by the outlined arrow C in FIG. 10D. As a result, the both side end portions 64*b* of the substrate elastic holder 64 develop so as to be separated from each other as indicated by the arrows E in FIG. 10D with the elastic force thereof, and are brought into contact with and frictionally engage with the inner peripheral surfaces of the engagement convex portions 62*e* on the both sides of the substrate seat 62*a* of the substrate support 62 as illustrated in FIG. 13B. At that time, on the both side end portions 64*b* of the substrate elastic holder 64, the first and second external connection terminals 66*a* and 66*b* of the reed screen shaped electrode of the surface acoustic wave excitation/detection unit 44 are connected to the first and second terminals 62*c* and 62*d* on the inner peripheral surfaces of the engagement convex portions 62*e*.

The substrate elastic holder 64 which brings the both side end portions 64*b* into contact with the inner surfaces of the engagement convex portions 62*e* on the both sides of the substrate seat 62*a* of the substrate support 62 and which makes the both side end portions 64*b* frictionally engage therewith as described above, presses the reed screen shaped electrode of the surface acoustic wave excitation/detection unit 66 arranged on the concave of the contacting portion 64*a* of the central portion toward the portion on the surface acoustic wave circulation path 42*a* on the outer surface of the surface acoustic wave propagation substrate 42, the portion being located opposite to the substrate seat 62*a*, by the elastic force thereof, and brings the both side end portions 64*b* into surface contact therewith, and further presses the portion excluding the surface acoustic wave circulation path 42*a* on the outer surface of the surface acoustic wave propagation substrate 42 (that is to say, the portions on the both sides of the surface acoustic wave circulation path 42a), on the substrate seat 62a of the substrate support 62.

As a result, the substrate elastic holder 64 easily detachably fixes the surface acoustic wave propagation substrate 42 onto the substrate seat 62a of the substrate support 62. Thus, although the substrate elastic holder 64 has a simple configuration, the substrate elastic holder 64 can surely, easily, and quickly support the surface acoustic wave propagation substrate 42 on the substrate seat 62a of the substrate support 62 with nothing attached to the surface acoustic wave circulation path 42a of the surface acoustic wave propagation substrate 42, and also can surely, easily, and quickly replace the surface acoustic wave propagation substrate 42 with new one including the surface acoustic wave circulation path 42a having a new sensitive film.

Further, the surface contact of the reed screen shaped electrode of the surface acoustic wave excitation/detection unit 66 arranged on the concave of the contacting portion 64a on the central portion of the substrate elastic holder 64 with the portion being opposite to the substrate seat 62a on the surface acoustic wave circulation path 42a on the outer surface of the surface acoustic wave propagation substrate 42, and the electric connection of the first and second external connection terminals 66a and 66b, which extend from the reed screen shaped electrode of the surface acoustic wave excitation/detection unit 66 arranged on the concave of the contacting portion 64a on the central portion of the substrate elastic holder 64 to the both side end portions 64b, to the first and second terminals 62c and 62d on the inner surfaces of the engagement convex portions 62e on the both sides of the substrate seat 62a of the substrate support 62, are surely performed.

In order to surely keep the contact of the both side end portions 64b of the substrate elastic holder 64 with the inner surfaces of the engagement convex portions 62e on the both sides of the substrate seat 62a of the substrate support 62 and to keep the frictional engagement of the both side end portions 64b therewith (that is to say, to surely fix the surface acoustic wave propagation substrate 42 on the substrate seat 62a of the substrate support 62 by the substrate elastic holder 64), it is necessary to satisfy following conditions.

That is to say, as illustrated in FIG. 13B, while the surface acoustic wave propagation substrate 42 is seated on the substrate seat 46a of the substrate support 46 and first and second two straight lines FL and SL are determined as follows, an angle α between the first straight line FL and the second straight line SL must be 90 degrees or smaller. And, the first straight line FL connects a first contact point FP, at which the contacting portion 64a on the central portion of the substrate elastic holder 64 is brought into contact with the portion of the outer surface of the surface acoustic wave propagation substrate 42, the portion being opposite side of the substrate seat 62a of the substrate support 62, with a second contact point SP, at which each of the both side end portions 64b of the substrate elastic holder 64 is first brought into contact with a corresponding engagement concave 62a of the substrate support 62. The second straight line SL connects the second contact point SP and a third contact point TP, at which the outer surface of the surface acoustic wave propagation substrate 42 is brought into contact with the substrate seat 62a of the substrate support 62 on a side of the second contact point SP.

If the angle α is larger than 90 degrees, it is difficult to surely and stably fix the substrate elastic holder 64 to the substrate support 62 in a dynamics view point regarding the frictional engagement of the both side end portions 64b of the substrate elastic holder 64 with the inner peripheral surfaces of the two engagement concaves 62e of the substrate support 62. The angle α is preferably set to be 70 degrees or smaller in order to further ensure the above-described fixing by the above-described frictional engagement using the elastic force of the both side end portions 64b of the substrate elastic holder 64 while vertical vibration is applied.

Modification of Fourth Embodiment

Next, a modification of the spherical surface acoustic wave apparatus 60 according to the fourth embodiment of the present invention will be described with reference to FIGS. 14A and 14B.

A spherical surface acoustic wave apparatus 60' according to the modification is different from the spherical surface acoustic wave apparatus 60 according to the fourth embodiment described above with reference to FIGS. 13A and 13B in configurations of a substrate support 62' and substrate elastic holder 64' both provided by a substrate supporting unit configured to support the surface acoustic wave propagation substrate 42, and in that the first and second terminals 62c and 62d for the first and second external connection terminals 66a and 66b of the reed screen shaped electrode of the surface acoustic wave excitation/detection unit 66 provided on the substrate elastic holder 64' are not provided on the substrate support 62' and are not used.

In the spherical surface acoustic wave apparatus 60' according to the modification, the same structural components of the spherical surface acoustic wave apparatus 60' as those of the spherical surface acoustic wave apparatus 60 according to the fourth embodiment are denoted by the same reference numerals denoting those of the spherical surface acoustic wave apparatus 60, and detailed description thereof are omitted.

In the spherical surface acoustic wave apparatus 60' according to the modification, as illustrated in FIG. 14A, the substrate support 62' has an angular U shape and extended end portions 62'g of a pair of side walls 62'f are bent so as to be away from each other in a direction orthogonal to an extending direction of the pair of side walls 62'f. A substrate seat 62'i on which the region excluding the surface acoustic wave circulation path 42a on an outer surface of the surface acoustic wave propagation substrate 42 is seated is provided on a wall 62'h on a central portion of the angular U-shaped substrate support 62'.

The substrate support 62' is formed of an electrically non-conductive material such as plastic or a glass epoxy material. Alternatively, the substrate support 62' may be formed of an electrically conductive material such as metal coated with the electrically nonconductive material such as the plastic.

A substrate seat 62'i is configured with a concave on which a region including the surface acoustic wave circulation path 42a on the outer surface of the surface acoustic wave propagation substrate 42 is seated. The concave has a size and shape substantially identical to the size and shape of the region on the outer surface of the surface acoustic wave propagation substrate 42, the region being to be seated on the concave, and is brought into line contact or surface contact with the region on the outer surface of the surface acoustic wave propagation substrate 42.

On the concave of the substrate seat 62'i, a portion 62'j corresponding to the surface acoustic wave circulation path 42a included in the region on the outer surface of the surface acoustic wave propagation substrate 42 seated thereon is further hollowed. As a result, portions on both sides of the surface acoustic wave circulation path 42a on the outer surface of the surface acoustic wave propagation substrate 42 (that is to say, the region excluding the surface acoustic wave circulation path 42a on the outer surface) are seated on an inner surface of the concave of the substrate seat 62'i.

The surface acoustic wave circulation path 42a of the surface acoustic wave propagation substrate 42 seated on the concave of the substrate seat 62a of the substrate support 62' in this manner is directed in a direction orthogonal to one surface of the wall 62'h on the central portion of the substrate support 62', in one surface of which the concave of the substrate seat 62'i is formed, and is directed in a predetermined circumferential position around the substrate seat 62'i on the one surface.

A width between the pair of side walls 62'f of the substrate support 62' is larger than the diameter of the spherical outer surface of the surface acoustic wave propagation substrate 42. Therefore, the pair of side walls 62'f are never brought into contact with the outer surface of the surface acoustic wave propagation substrate 42 seated on the substrate seat 62'i of the wall 62'h on the central portion of the substrate support 62' as described above.

An extending length of each of the pair of side walls 62'f from the wall 62'h on the central portion to each extended end portion 62'g is shorter than the diameter of the outer surface of the surface acoustic wave propagation substrate 42.

Both end portions of the plate-shaped substrate elastic holder 64' which exert elastic resistances against bending, are detachably fixed to the extended end portions 62'g of the pair of side walls 62'f of the substrate support 62'. In the modification, the both end portions of the plate-shaped substrate elastic holder 64' are detachably fixed to the extended end portions 62'g with known easily detachable fixing elements 62'k including fixing screws or fixing pins, for example. The substrate elastic holder 64' fixed in this manner blocks an opening between the extended end portions 62'g of the pair of side walls 62'f of the substrate support 62'. At this time, the central portion of the plate-shaped substrate elastic holder 64' is brought into contact with the portion being located opposite to the substrate seat 62'i of the substrate support 62' in the surface acoustic wave circulation path 42a on the outer surface of the surface acoustic wave propagation substrate 42 seated on the substrate seat 62' of the wall 62'h of the central portion of the substrate support 62'. Also, since the both end portions of the plate-shaped substrate elastic holder 64' are easily detachably fixed to the extended end portions 62'g of the pair of side walls 62'f of the substrate support 62' with the known fixing elements 62'k, the both sides of the contacting portion 64a on the central portion of the substrate elastic holder 64' are pressed against their elastic resistances toward the substrate seat 62'i of the substrate support 62'.

The central portion of the plate-shaped substrate elastic holder 64' presses the surface acoustic wave propagation substrate 42 toward the substrate seat 62'i of the substrate support 62' with the elastic force generated by the pressing, and elastically sandwiches the surface acoustic wave propagation substrate 42 in cooperation with the substrate seat 62'i.

As illustrated in FIG. 14B, the contacting portion 64a on the central portion of the substrate elastic holder 64' is configured of a concave having a size and shape substantially identical to the size and shape of the portion of the surface acoustic wave circulation path 42a on the outer surface of the surface acoustic wave propagation substrate 42, the portion being located to opposite to the substrate seat 62'i of the substrate support 62' and being to be brought into contact with the contacting portion 64a.

The reed screen shaped electrode of the surface acoustic wave excitation/detection unit 66 is arranged On the contacting portion 64a of the substrate elastic holder 64'. The substrate elastic holder 64' is configured with electrically nonconductive material such as plastic which exerts elastic resistance against bending, and the reed screen shaped electrode of the surface acoustic wave excitation/detection unit 66 is formed on a surface of such substrate elastic holder 64' by a known terminal forming process. In this embodiment, the surface acoustic wave excitation/detection unit 66 and the first and second external connection terminals 66a and 66b are shaped by performing photolithography (photoengraving) to a metal thin film having excellent conductivity such as gold, copper and aluminum attached to the outer surface of the substrate elastic holder 64'.

The first and second external connection terminals 66a and 66b for the reed screen shaped electrode are formed together with the reed screen shaped electrode on the surface of the substrate elastic holder 64'. In this modification, the first and second external connection terminals 66a and 66b of the reed screen shaped electrode of the surface acoustic wave excitation/detection unit 66 are directly connected to the operation control unit 50 illustrated in FIG. 13B. Therefore, as in the case of the spherical surface acoustic wave apparatus 60 according to the fourth embodiment described above, one of the first and second external connection terminals 66a and 66b of the reed screen shaped electrode may be connected to the ground, and this does not cause any problem and this is preferable to prevent noise.

An amount of deflection of the substrate elastic holder 64' of the modification when it is pressed against the elastic force is smaller than that of the substrate elastic holder 64 of the fourth embodiment described above with reference to FIGS. 13A and 13B. Therefore, it is possible to form the substrate elastic holder 64' of the electrically conductive material such as metal coated with electrically nonconductive material such as plastic and to form the reed screen shaped electrode and the first and second external connection terminals 66a and 66b of the surface acoustic wave excitation/detection unit 66 on the coating of the electrically nonconductive material. However, in this case, the coating of the electrically nonconductive material must have a thickness sufficient for preventing short-circuit of the pair of comb-shaped terminals 66c and 66d of the reed screen shaped electrode through the electrically conductive material coated with the electrically nonconductive material when a high-frequency signal is applied to the reed screen shaped electrode of the surface acoustic wave excitation/detection unit 66 to excite the surface acoustic wave. Alternatively, it is possible to coat only a portion or the portion and its vicinity of the substrate elastic holder 64' formed of the electrically conductive material with a material configured to prevent the above-described short-circuit, on that portion the pair of comb-shaped terminals 66c and 66d of the reed screen shaped electrode of the surface acoustic wave excitation/detection unit 66 being arranged (the concave 64a in this modification).

When the substrate elastic holder 64' is configured with more flexible plastic as far as this plastic exerts elastic resistance necessary against bending, the substrate elastic holder 64' can more stably hold the outer surface of the surface acoustic wave propagation substrate 42 with improved contact to the outer surface of the surface acoustic wave propagation substrate 42. Alternatively, by forming the electrically nonconductive film more flexible than the plastic which configures the substrate elastic holder 64', only on the contacting portion 64a on the central portion of the substrate elastic holder 64' (that is to say, the concave on which the reed screen shaped electrode of the surface acoustic wave excitation/ detection unit 66 is arranged), the outer surface of the surface acoustic wave propagation substrate 42 can be more stably held with the improved contact to the outer surface of the surface acoustic wave propagation substrate 42.

Further, as in the case of the fourth embodiment described above with reference to FIGS. 13A and 13B, a part other than the plurality of teeth like electrode branches 66e of the reed screen electrode may be hollowed than the plurality of teeth like electrode branches 36e in the contacting portion 64a on the central portion of the substrate elastic holder 64' on which the reed screen shaped electrode of the surface acoustic wave excitation/detection unit 66 is formed. In this manner, when the contacting portion 64a on the central portion of the substrate elastic holder 64' (that is to say, the concave on which the reed screen shaped electrode of the surface acoustic wave excitation/detection unit 66 is arranged) is brought into contact with the surface acoustic wave circulation path 12a on the outer surface of the surface acoustic wave propagation substrate 42, nothing other than the plurality of teeth like electrode branches 36e of the reed screen shaped electrode is brought into contact with the surface acoustic wave circulation path 42a. As a result, attenuation of propagation energy of the surface acoustic wave excited and propagated by the reed screen shaped electrode in the surface acoustic wave circulation path 12a can be further decreased.

Fifth Embodiment

Figure 15A:
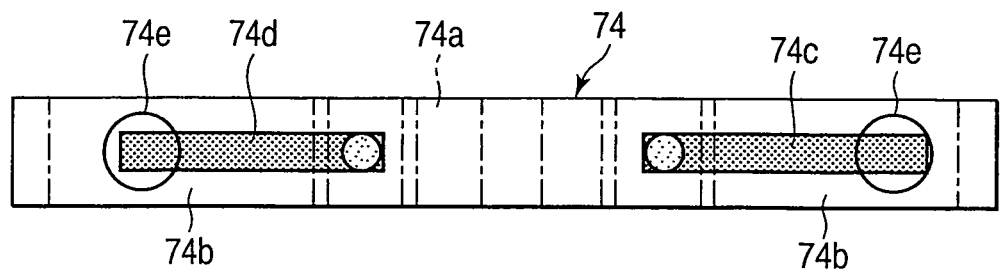
FIG. 15A is a schematic rear view of a band plate-shaped substrate holder used in a spherical surface acoustic wave apparatus according to a fifth embodiment of the present invention.
Figure 15B:
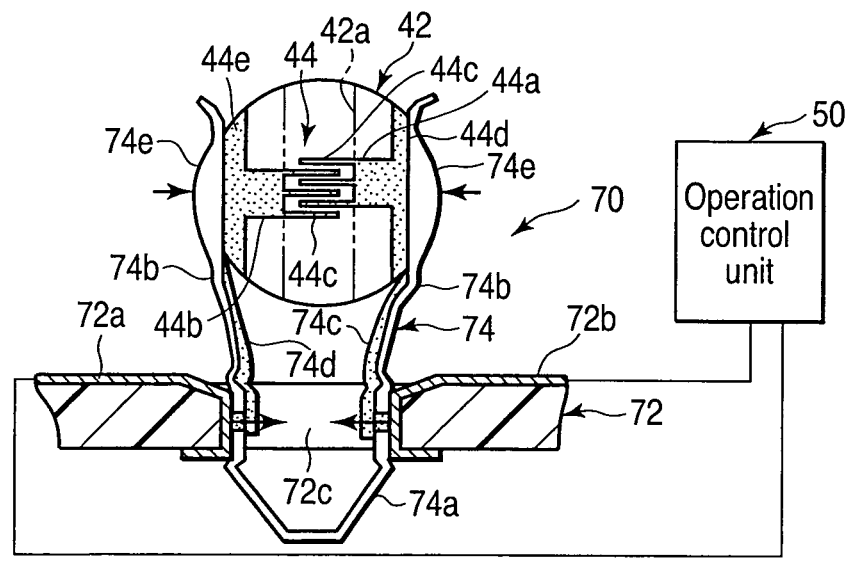
FIG. 15B is a schematic vertical cross-sectional view of a state in which a fixing portion between a pair of both side portions of the band plate-shaped substrate holder is fixed to a support while the pair of both side portions sandwich a surface acoustic wave propagation substrate after the substrate holder in FIG. 15A is bent into a substantially U shape, in the spherical surface acoustic wave apparatus according to the fifth embodiment of the present invention.

Next, a spherical surface acoustic wave apparatus 70 according to a fifth embodiment of the present invention will be described with reference to FIGS. 15A and 15B.

The spherical surface acoustic wave apparatus 70 according to the fifth embodiment uses the surface acoustic wave propagation substrate 42 identical to the surface acoustic wave propagation substrate 42 used in a spherical surface acoustic wave apparatus 40 according to the third embodiment of the present invention described above with reference to FIGS. 9 to 11. That is to say, the surface acoustic wave propagation substrate 42 includes, on the outer surface thereof, the surface acoustic wave circulation path 42a configured to be annular and continuous using at least the part of the spherical shape in which the surface acoustic wave can be excited and the excited surface acoustic wave can propagate and circulate in the continuous direction of the annular shape. The surface acoustic wave excitation/detection unit 44 is provided on the surface acoustic wave circulation path 42a of the surface acoustic wave propagation substrate 42 used in the spherical surface acoustic wave apparatus 70 according to the fifth embodiment as in the case of the surface acoustic wave propagation substrate 42 used in the spherical surface acoustic wave apparatus 40 according to the third embodiment.

A substrate supporting unit provided in the spherical surface acoustic wave apparatus 70 to configure to support the surface acoustic wave propagation substrate 42, is provided with a support 72 and a substrate holder 74 for holding the surface acoustic wave propagation substrate 42 in one side of the support 42.

In this embodiment, the support 72 is formed of electrically nonconductive material such as plastic or glass epoxy material, and may be formed using a wiring substrate generally referred as a printed wiring board.

Also, in this embodiment, the substrate holder 74 includes a fixing portion 74a fixed to a predetermined position of the support 72 and a pair of holders 74b projected from the fixing portion 74a toward in one side of the support 72. The pair of holders 74b sandwiches a region on an outer surface of the surface acoustic wave propagation substrate 42 excluding the surface acoustic wave circulation path 42a from both sides in a radial direction of the surface acoustic wave propagation substrate 42 to hold the surface acoustic wave propagation substrate 42 at a position being away from the support 72 in one side of the support 72.

In this embodiment, the substrate holder 74 is configured with material having elasticity such as plastic into a substantially U shape. In the substantially U-shaped substrate holder 74, a central portion configures the fixing portion 74a and a pair of both side portions configures the pair of holders 74b.

In this embodiment, the pair of holders 74b of the substrate holder 74 elastically sandwich portions located directly opposite to each other in the radial direction of the surface acoustic wave propagation substrate 42 on both sides of the surface acoustic wave circulation path 42a on the outer surface of the surface acoustic wave propagation substrate 42, from the both sides in the radial direction. The pair of first and second external connection terminals 44d and 44e for the pair of comb-shaped terminals 44a and 44b of the surface acoustic wave excitation/detection unit 44 are arranged on the directly opposed portions on the outer surface of the surface acoustic wave propagation substrate 42.

The pair of holders 74b of the substrate holder 74 are provided with a pair of conducting paths 74c and 74d. The conducting paths 74c and 74d extend between positions, which are brought into contact with the first and second external connection terminals 44a and 44b for the surface acoustic wave excitation/detection unit 44, and the fixing portion 74a.

When the substrate holder 74 is configured by the electrically nonconductive material such as the plastic, the pair of conducting paths 74c and 74d may be configured by attaching electrically conductive material such as gold, copper and aluminum to a surface of the substrate holder 74.

The support 72 is provided with a pair of terminals 72a and 72b which are brought into contact with the pair of conducting paths 74c and 74d at the fixing portion 74a of the substrate holder 74. The pair of terminals 72a and 72b are connected to the known operation control unit 50 identical to the known operation control unit 50 used for the surface acoustic wave excitation/detection unit 44 of the surface acoustic wave propagation substrate 42 in the spherical surface acoustic wave apparatus 40 according to the third embodiment described above with reference to FIGS. 9 to 11.

Generally, one of a pair of electrodes is often a ground electrode in a normal electronic circuit. And, in the present invention, one of the pair of terminals 72a and 72b of the substrate support 72 to which the pair of external connection terminals 44d and 44e of the reed screen shaped electrode are connected may be connected the ground, and this does not cause problem and this is preferable to prevent noise.

Portions of the pair of holders 74b of the substrate holder 74 to sandwich the region excluding the surface acoustic wave circulation path 42a on the outer surface of the surface acoustic wave propagation substrate 42, are configured as concaves 74e each of which accepts each portions corresponding thereto (that is the region excluding the surface acoustic wave circulation path) on the outer surface of the surface acoustic wave propagation substrate 42 and brought into line contact or surface contact with each of the corresponding portions.

In this embodiment, a fit concave 72c is formed in a predetermined position of the support 72 to which the fixing portion 74a of the substrate holder 74 is fixed. The fixing portion 74a on the central portion of the substrate holder 74 configured with a material having elasticity into a substantially U shape, is easily detachably fixed to the predetermined position of the support 72 by fitting the fixing portion 74a into the fit concave 42c in the predetermined position of the support 72.

The pair of terminals 72a and 72b of the support 72 are arranged on an inner peripheral surface of the fit concave 72c and are brought into contact with the pair of conducting paths 74c and 74d of the substrate holder 74 at the fixing portion 74a thereof by fitting the fixing portion 74a on the central portion of the substrate holder 74 into the fit concave 72c.

In this embodiment, the surface acoustic wave propagation substrate 42 can be easily inserted and removed between the pair of holders 74b by moving the pair of holders 74b of the substrate holder 74 away from each other against their elasticity. By moving the pair of holders 74b to approach each other by their elasticity after the surface acoustic wave propagation substrate 42 is located between the pair of holders 74b moved away from each other of the substrate holder 74, the surface acoustic wave propagation substrate 42 can be easily held by the pair of holders 74b at a position located away from the support 72 in one side of the support 72, as illustrated in FIG. 15B.

At that time, the concaves 74e of the pair of holders 74b of the substrate holder 74 accept the pair of external connection terminals 74a and 74b of the surface acoustic wave excitation/detection unit 44 located on the both sides of the surface acoustic wave circulation path 42a on the outer surface of the surface acoustic wave propagation substrate 42, and are brought into line contact or surface contact with the pair of external connection terminals 74a and 74b. As a result, the pair of external connection terminals 44d and 44e of the surface acoustic wave excitation/detection unit 44 are connected to the operation control unit 50 through the conducting paths 74c and 74d arranged on the concaves 74e of the pair of holders 74b of the substrate holder 74 and the pair of terminals 72a and 72b connected to the conducting paths 74c and 74d at the support 72. At this time, nothing is brought into contact with the surface acoustic wave circulation path 42a on the outer surface of the surface acoustic wave propagation substrate 42.

It is preferable that a size and shape of each of the concaves 74a of the pair of holders 74b of the substrate holder 74 are substantially identical to a size and shape of each of the portions on the both sides of the surface acoustic wave circulation path 42a on the outer surface of the surface acoustic wave propagation substrate 42, the portions directly opposing to each other in the radial direction of the surface acoustic wave propagation substrate 42 and accepted by the concaves 74a.

If the size and shape of each of the concaves 74e of the pair of holders 74b are not substantially identical to the size and shape of each of the radially directly opposed portions on the both sides of the surface acoustic wave circulation path 42a on the outer surface of the surface acoustic wave propagation substrate 42, each of the concaves 74e of the pair of holders 74b is locally brought into contact with each of the radially directly opposed portions. As a result, strong pressure is locally applied to the pair of external connection terminals 44d and 44e of the surface acoustic wave excitation/detection unit 44 of the surface acoustic wave propagation substrate 42 located on the radially directly opposed portions so that the pair of external connection terminals 44d and 44e may be broken.

Sixth Embodiment

Next, a spherical surface acoustic wave apparatus 80 according to a sixth embodiment of the present invention will be described with reference to FIGS. 16A and 16B.

The spherical surface acoustic wave apparatus 80 according to the sixth embodiment uses the surface acoustic wave propagation substrate 42 identical to the surface acoustic wave propagation substrate 42 used in the spherical surface acoustic wave apparatus 40 according to the third embodiment of the present invention described above with reference to FIGS. 3 to 11. That is to say, the surface acoustic wave propagation substrate 42 includes, on the outer surface thereof, the surface acoustic wave circulation path 42a configured to be annular and continuous using at least the part of the spherical shape in which a surface acoustic wave can be excited and the excited surface acoustic wave can propagate and circulate in the continuous direction of the annular shape. The surface acoustic wave circulation path 42a of the surface acoustic wave propagation substrate 42 used in the spherical surface acoustic wave apparatus 80 according to the sixth embodiment is provided with the surface acoustic wave excitation/detection unit 44 as in the case of the surface acoustic wave propagation substrate 42 used in the spherical surface acoustic wave apparatus 40 according to the third embodiment.

A substrate supporting unit which is provided in the spherical surface acoustic wave apparatus 80 according to the sixth embodiment and which is configured to support the surface acoustic wave propagation substrate 42, includes a support 82 and a substrate holder 84 which holds the surface acoustic wave propagation substrate 42 in one side of the support 82.

In this embodiment, the support 82 is formed of electrically nonconductive material such as plastic or glass epoxy material, and may be formed using a wiring substrate generally referred as a printed wiring board.

In this embodiment, the substrate elastic holder 84 is configured as a substantially U-shaped band plate with material having elasticity such as plastic. A pair of both side portions 84a of the substantially U-shaped substrate elastic holder 84 elastically sandwich a region on the outer surface of the surface acoustic wave propagation substrate 42, the region excluding the surface acoustic wave circulation path 42a, from both sides in the radial direction of the surface acoustic wave propagation substrate 42 to hold the surface acoustic wave propagation substrate 42 at a position being away from the support 82 in one side of the support 82, and ends 84b of the pair of both side portions 84a are easily detachably fixed to the support 82 against its elastic force.

In this embodiment, the pair of both side portions 84a of the substrate elastic holder 84 elastically sandwich portions, which are directly opposed to each other in the radial direction of the surface acoustic wave propagation substrate 42, on both sides of the surface acoustic wave circulation path 42a on the outer surface of the surface acoustic wave propagation substrate 42 from the both sides in the radial direction. The pair of first and second external connection terminals 44d and 44e of the pair of comb-shaped terminals 44a and 44b of the surface acoustic wave excitation/detection unit 44 are arranged on the directly opposed portions on the outer surface of the surface acoustic wave propagation substrate 42.

The pair of both side portions 84a of the substrate elastic holder 84 are provided with a pair of conducting paths 84c and 84d which extend from positions at which the both side portions 84a are brought into contact with the first and second external connection terminals 44a and 44b of the surface acoustic wave excitation/detection unit 44, to the pair of ends 84b.

When the substrate elastic holder 84 is configured with electrically nonconductive material such as plastic, the pair of conducting paths 84c and 84d are shaped on a surface of the substrate holder 84 by performing photolithography (photoengraving) to a metal thin film having excellent electrical conductivity such as gold, copper and aluminum.

The support 82 is provided with a pair of terminals 82a and 82b which are brought into contact with the pair of conducting paths 84c and 84d of the pair of both side portions 84a, on its positions to which the ends 84b of the pair of both side portions 84a of the substrate elastic holder 84 are easily detachably fixed. The pair of terminals 82a and 82b are connected to the known operation control unit 50 identical to the known operation control unit 50 used for the surface acoustic wave excitation/detection unit 44 of the surface acoustic wave propagation substrate 42 in the spherical surface acoustic wave apparatus 40 according to the third embodiment described above with reference to FIGS. 9 to 11.

Generally, one of a pair of electrodes is often made as a ground electrode in a normal electronic circuit. Therefore, in the present invention, one of the pair of terminals 82a and 82b of the support 82 to which the pair of external connection terminals 44d and 44e of the reed screen shaped electrode are connected, may be connected the ground, and this does not cause problem and this is preferable to prevent noise.

Portions for sandwiching the region excluding the surface acoustic wave circulation path 42a on the outer surface of the surface acoustic wave propagation substrate 42, of the pair of both side portions 84a of the substrate elastic holder 84 are configured as concaves 84e which accept the corresponding portions (that is, the above described region) on the outer surface of the surface acoustic wave propagation substrate 42 and which brought into line contact or surface contact with the corresponding portion.

It is preferable that a size and shape of each of the concaves 84e of the pair of both side portions 84a of the substrate elastic holder 84 are substantially identical to the size and shape of the region excluding the surface acoustic wave circulation path 42a and accepted therein on the outer surface of the surface acoustic wave propagation substrate 42 (portions directly opposed to each other in the radial direction of the surface acoustic wave propagation substrate 42 on the both sides of the surface acoustic wave circulation path 42a in this embodiment).

If the size and shape of each of the concaves 84e of the pair of both side portions 84a are not substantially identical to the size and shape of the region excluding the surface acoustic wave circulation path 42a and accepted therein on the outer surface of the surface acoustic wave propagation substrate 42, inner surfaces of the concaves 84e of the pair of both side portions 84a are locally brought into contact with the region excluding the surface acoustic wave circulation path 42a and accepted therein on the outer surface of the surface acoustic wave propagation substrate 42. As a result, a strong pressure is locally applied to the first and second external connection terminals 44d and 44e of the surface acoustic wave excitation/detection unit 44 of the surface acoustic wave propagation substrate 42 in the region, and it is possible that the first and second external connection terminals 44d and 44e are broken.

In this embodiment, engagement concave 82c is formed in a predetermined position of the support 82 to which the ends 84b of the pair of both side portions 84a of the substrate elastic holder 84 are fixed. By engaging the ends 84b of the pair of both side portions 84a of the substrate elastic holder 84 configured with the material having elasticity and into the substantially U shape, with the engagement concave 82c in the predetermined position of the support 82 against its elastic force, the ends 84b of the pair of both side portions 84a of the substrate elastic holder 84 are easily detachably fixed to the engagement concave 82c in the predetermined position of the support 82.

The pair of terminals 82a and 82b of the support 82 are arranged on an inner peripheral surface of the engagement concave 82c. When the ends 84b of the pair of both side portions 84a of the substrate elastic holder 84 are engaged with the engagement concave 82c against its elastic force, the pair of terminals 82a and 82b of the support 82 are brought into contact with the pair of conducting paths 84c ad 84d of the substrate elastic holder 84 at the ends 84b of the pair of both side portions 84a of the substrate elastic holder 84.

The surface acoustic wave propagation substrate 42 held by the pair of both side portions 84a of the substrate elastic holder 84 at the position being away from the support 82 on one side of the support 82 as illustrated in FIG. 16B, can be easily inserted and removed between the pair of both side portions 84a of the substrate elastic holder 84 in a following manner.

First, the ends 84b of the pair of both side portions 84a of the substrate elastic holder 84 are approached each other against its elasticity, and next, the ends 84b of the pair of both side portions 84a are removed from the engagement concave 82c in the predetermined position of the support 82. Thereafter, the ends 84b of the pair of both side portions 84a are moved away from each other by its elasticity, and the surface acoustic wave propagation substrate 42 can be easily inserted and removed between the pair of both side portions 84a.

A procedure by which the pair of both side portions 84a of the substrate elastic holder 84 hold the surface acoustic wave propagation substrate 42 at the position being away from the support 82 on one side of the support 82 as illustrated in FIG. 16B is as follows.

While the pair of both side portions 84a of the substrate elastic holder 84 are separated from each other and the surface acoustic wave propagation substrate 42 is inserted between the concaves 84e of the pair of separated both side portions 84a of the substrate elastic holder 84, the ends 84b of the pair of both side portions 84a are approached each other against its elasticity, and in this state, the ends 84b of the pair of both side portions 84a are inserted to the engagement concave 82c in the predetermined position of the support 82. After that, the ends 84b of the pair of both side portions 84a are moved away from each other by its elasticity so that the ends 84b of the pair of both side portions 84a are engaged with the engagement concave 82c in the predetermined position of the support 82.

At that time, the concaves 84e of the pair of both side portions 84a of the substrate elastic holder 84 accept the first and second external connection terminals 44a and 44b of the surface acoustic wave excitation/detection unit 44 located on the both sides of the surface acoustic wave circulation path 42a on the outer surface of the surface acoustic wave propagation substrate 42, and brought into line contact or surface contact with the first and second external connection terminals 44a and 44b. As a result, the first and second external connection terminals 44a and 44b of the surface acoustic wave excitation/detection unit 44 are connected to the operation control unit 50 through the conducting paths 84c and 84d arranged on the concaves 84e and the pair of terminals 82a and 82b connected to the conducting paths 84c and 84d at the support 82. Also, nothing is brought into contact with the surface acoustic wave circulation path 42a on the outer surface of the surface acoustic wave propagation substrate 42.

Seventh Embodiment

Figure 17A:
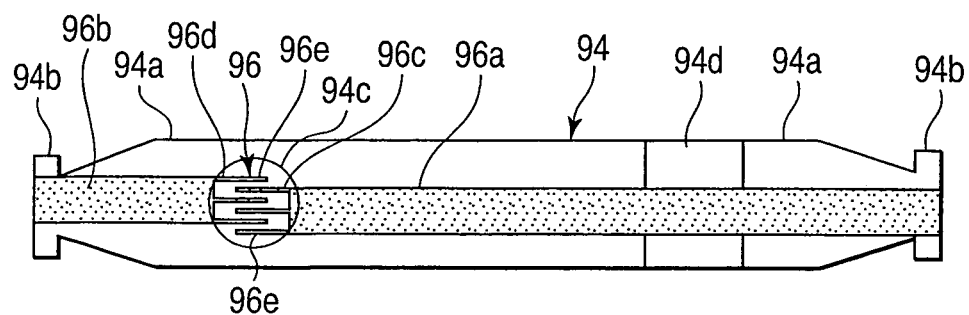
FIG. 17A is a schematic rear view of a band plate-shaped substrate elastic holder used in a spherical surface acoustic wave apparatus according to a seventh embodiment of the present invention.

Next, a spherical surface acoustic wave apparatus 90 according to a seventh embodiment of the present invention will be described with reference to FIGS. 17A and 17B.

The spherical surface acoustic wave apparatus 90 according to the seventh embodiment uses the surface acoustic wave propagation substrate 42 identical to the surface acoustic wave propagation substrate 42 used in the spherical surface acoustic wave apparatus 40 according to the third embodiment of the present invention described above with reference to FIGS. 9 to 11. That is to say, the surface acoustic wave propagation substrate 42 includes, on the outer surface thereof, the surface acoustic wave circulation path 42a configured to be annular and continuous using at least the part of the spherical shape in which a surface acoustic wave can be excited and the excited surface acoustic wave can propagate and circulate in the continuous direction of the annular shape. However, the surface acoustic wave circulation path 42a of the surface acoustic wave propagation substrate 42 used in the spherical surface acoustic wave apparatus 90 according to the seventh embodiment is not provided with the surface acoustic wave excitation/detection unit 44 provided on the surface acoustic wave circulation path 42a on the surface acoustic wave propagation substrate 42 used in the spherical surface acoustic wave apparatus 40 according to the third embodiment.

A substrate supporting unit provided in the spherical surface acoustic wave apparatus 90 and configured to support the surface acoustic wave propagation substrate 42, includes a support 92 and a substrate elastic holder 94 for holding the surface acoustic wave propagation substrate 42 on one side of the support 92.

In this embodiment, the support 92 is formed of electrically nonconductive material such as plastic or glass epoxy material, and may be formed using a wiring substrate generally referred as a printed wiring board.

In this embodiment, the substrate elastic holder 94 is configured as a substantially U-shaped band plate with electrically nonconductive material having elasticity such as plastic. One of a pair of both side portions 94a of the substantially U-shaped substrate elastic holder 94 is brought into contact with the surface acoustic wave circulation path 42a on the outer surface of the surface acoustic wave propagation substrate 42 and the other of the pair of both side portions 94a is brought into contact with a region on the outer surface of the surface acoustic wave propagation substrate 42 excluding the surface acoustic wave circulation path 42a from a side opposite to the one of the pair of both side portions 94a in a radial direction of the surface acoustic wave propagation substrate 42, and as a result, the surface acoustic wave propagation substrate 42 is elastically sandwiched by the pair of both side portions 94a of the substantially U-shaped substrate elastic holder 94. And, the ends 94b of the pair of both side portions 94a are easily detachably fixed to the support 92 against its elastic force, the surface acoustic wave propagation substrate 42 is held at the position being away from the support 92 on one side of the support 92.

In the one of the pair of both side portions 94a, a concave 94c is formed on a portion which is brought into contact with a region including the surface acoustic wave circulation path 12a on the outer surface of the surface acoustic wave propagation substrate 42. A size and shape of the concave 94c are set to be substantially identical to a size and shape of the region on the outer surface of the surface acoustic wave propagation substrate 42, the region being seated thereon, and the concave 94c is brought into surface contact with the seated region on the outer surface of the surface acoustic wave propagation substrate 42.

In the other of the pair of both sides 94a, a portion, which is brought into contact with the region excluding the surface acoustic wave circulation path 42a on the outer surface of the surface acoustic wave propagation substrate 42, is configured as a bridge-shaped portion 94d which is brought into contact with positions away from the surface acoustic wave circulation path 42a on both sides of the surface acoustic wave circulation path 42a (that is to say, the region excluding the surface acoustic wave circulation path 42a on the outer surface) and which bridges over the surface acoustic wave circulation path 42a.

On the one of the pair of both side portions 94a of the substrate elastic holder 94, a surface acoustic wave excitation/detection unit 96 is provided on a portion which is brought into contact with the region including the surface acoustic wave circulation path 42a on the outer surface of the surface acoustic wave propagation substrate 42 (in this embodiment, an inner surface of the concave 94c with which the region is brought into surface contact). And, the surface acoustic wave excitation/detection unit 96 is used for exciting and circulating a surface acoustic wave in the surface acoustic wave circulation path 42a and for detecting the surface acoustic wave which circulates in the surface acoustic wave circulation path 42a.

The surface acoustic wave excitation/detection unit 96 is provided with first and second external connection terminals 96a and 96b which extend toward the ends 94b of the pair of both side portions 94a of the substrate elastic holder 94.

When the substrate elastic holder 94 is configured with electrically nonconductive material such as plastic, the surface acoustic wave excitation/detection unit 96 and the first and second external connection terminals 96a and 96b can be shaped on a surface of the substrate elastic holder 94 by performing photolithography (photoengraving) to a metal thin film having excellent conductivity such as gold, copper and aluminum.

The substrate support 92 is provided with first and second terminals 92a and 92b which are brought into contact with the first and second external connection terminals 96a and 96b at the ends 94b of the pair of both side portions 94a of the substrate elastic holder 94, on its positions to which the ends 94b of the pair of both side portions 94a of the substrate elastic holder 94 are detachably fixed. The first and second terminals 92a and 92b are connected to the known operation control unit 50 for controlling an operation of the surface acoustic wave excitation/detection unit 96. The known operation control unit 50 is identical to the known operation control unit 50 used for the surface acoustic wave excitation/detection unit 44 of the surface acoustic wave propagation substrate 42 in the spherical surface acoustic wave apparatus 40 according to the third embodiment described above with reference to FIGS. 9 to 11.

Therefore, as in the case of the spherical surface acoustic wave apparatus 40 according to the third embodiment described above, one of the first and second terminals 92a and 92b of the substrate support 92 to which the first and second external connection terminals 96a and 96b of the surface acoustic wave excitation/detection unit 96 are connected may be connected the ground, and this does not cause problem and this is preferable to prevent noise.

In this embodiment, the surface acoustic wave excitation/detection unit 96 is configured with the reed screen shaped electrode identical to that, which configures the surface acoustic wave excitation/detection unit 44, in the spherical surface acoustic wave apparatus 40 of the third embodiment of the present invention described above with reference to FIGS. 9 to 11.

That is to say, the reed screen shaped electrode is configured by combining a pair of comb-shaped terminals 96c and 96d such that a plurality of teeth like electrode branches 96e of one comb-shaped terminal 96c and a plurality of teeth like electrode branches 96e of the other comb-shaped terminal 96d are alternately arranged.

On one of the pair of both side portions 94a of the substrate elastic holder 94, the reed screen shaped electrode of the surface acoustic wave excitation/detection unit 96 is arranged on a portion, which is brought into contact with the region including the surface acoustic wave circulation path 42a on the outer surface of the surface acoustic wave propagation substrate 42 (in this embodiment, the concave 94c with which the region is brought into surface contact), in a following manner.

Figure 17B:
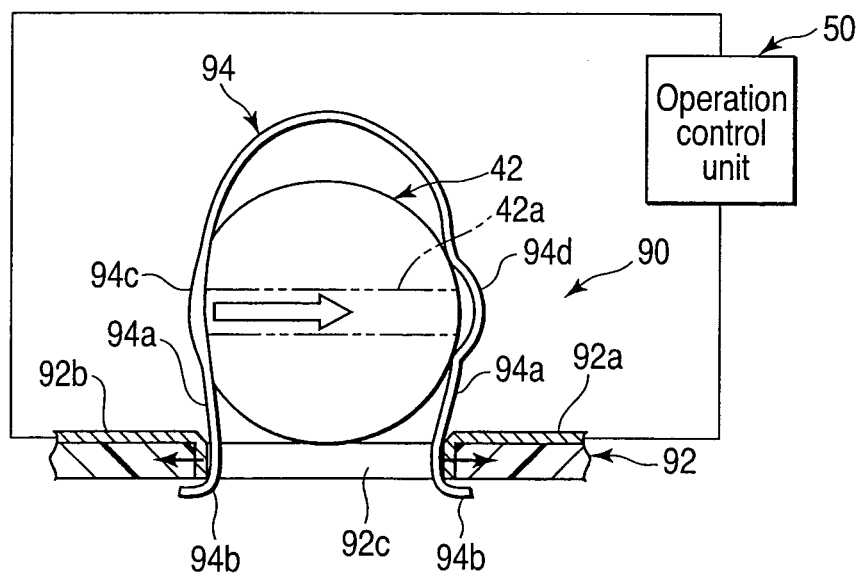
FIG. 17B is a schematic vertical cross-sectional view of a state in which end portions of a pair of both sides of the band plate-shaped substrate elastic holder are fixed to a support while the pair of both sides sandwich a surface acoustic wave propagation substrate after the substrate elastic holder in FIG. 17A is bent into a substantially U shape in the spherical surface acoustic wave apparatus according to the seventh embodiment of the present invention.

That is to say, as illustrated in FIG. 17B, when the concave 94c of one of the pair of both side portions 94a of the substrate elastic holder 94 is brought into surface contact with the surface acoustic wave circulation path 42a on the outer surface of the surface acoustic wave propagation substrate 42, the bridge-shaped portion 94d of the other of the pair of both side portions 94a is brought into contact with the region excluding the surface acoustic wave circulation path 42a on the outer surface of the surface acoustic wave propagation substrate 12 and further the ends 94b of the pair of the both side portions 94a of the substrate elastic holder 94 are detachably fixed to the substrate support 92, a direction in which the plurality of teeth like electrode branches 96e of the pair of comb-shaped terminals 96c and 96d of the reed screen shaped electrode are alternately arranged conforms to the annularly extending direction of the surface acoustic wave circulation path 42a and an extending direction of each of the plurality of teeth like electrode branches 96e is preferably orthogonal to the annularly extending direction of the surface acoustic wave circulation path 42a.

As illustrated in FIG. 17B, when a high-frequency signal of a predetermined frequency is applied in a burst manner to the pair of comb-shaped terminals 96c and 96d of the surface acoustic wave excitation/detection unit 96 by the known operation control unit 50 through the first and second external connection terminals 96a and 96b of the pair of both side portions 64a of the substrate elastic holder 64 and the first and second terminals 92a and 92b of the substrate support 92 while the surface acoustic wave propagation substrate 42 is held at the position being away from the substrate support 92 on one side of the substrate support 92 by the pair of both side portions 64a of the substrate elastic holder 64, the pair of comb-shaped terminals 96c and 96d can excite a surface acoustic wave having a predetermined wavelength in the surface acoustic wave circulation path 42a on the outer surface of the surface acoustic wave propagation substrate 42 and propagate the excited surface acoustic wave in the annularly extending direction of the surface acoustic wave circulation path 42a. Herein, each of the predetermined frequency and the predetermined wavelength corresponds to a period of arrangement of the plurality of teeth like electrode branches 96e.

A width of the surface acoustic wave excited by the reed screen shaped electrode in the surface acoustic wave circulation path 42a is a distance (electrode width) with which adjacent two teeth like electrode branches 96e out of the plurality of teeth like electrode branches 96e of the pair of comb-shaped terminals 96c and 96d of the reed screen shaped electrode are opposed to each other.

It is known from the above-described International Publication No. WO 01/45255 A1, that, when the surface acoustic wave having the width in a predetermined range and the predetermined wavelength is excited in the extending direction of the surface acoustic wave circulation path 42a in the surface acoustic wave circulation path 42a having a predetermined radius, such surface acoustic wave can repeatedly circulate in the surface acoustic wave circulation path 42a in the extending direction thereof without diffusing in the direction orthogonal to the extending direction.

The known operation control unit 50 can detect the surface acoustic wave, which circulates in the surface acoustic wave circulation path 42a, by the reed screen shaped electrode of the surface acoustic wave excitation/detection unit 96, which is brought into contact with the surface acoustic wave circulation path 42a.

In this embodiment, the reed screen shaped electrode of the surface acoustic wave excitation/detection unit 96 formed on the concave 94c on one of the pair of both side portions 94a of the substrate elastic holder 94 as described above and brought into surface contact with the surface acoustic wave circulation path 42a on the outer surface of the surface acoustic wave propagation substrate 42 as described above, attenuates propagation energy of the surface acoustic wave and decreases the number of circulations of the surface acoustic wave due to collision of the surface acoustic wave, which circulates in the surface acoustic wave circulation path 42a, with the reed screen shaped electrode. However, an entire length of the reed screen shaped electrode in the extending direction of the surface acoustic wave circulation path 42a (that is to say, a length of arrangement of the plurality of teeth like electrode branches 96e in the direction in which the plurality of teeth like electrode branches 96e of the pair of comb-shaped terminals 96c and 96d of the reed screen shaped electrode are arranged) is much shorter than the annular extending length of the surface acoustic wave circulation path 42a, and an area of contact of the reed screen shaped electrode with the surface acoustic wave circulation path 42a is significantly smaller than an entire area of the surface acoustic wave circulation path 42a. Therefore, a ratio of attenuation of the propagation energy when the surface acoustic wave, which circulates in the surface acoustic wave circulation path 42a, collides with the reed screen shaped electrode is small and the surface acoustic wave can perform significant multiple circulations for desired measurement.

It is possible to prevent a position other than the plurality of comb-shaped electrode branches 96e of the reed screen shaped electrode from being brought into contact with the surface acoustic wave circulation path 42a in the concave 94 by hollowing the position other than the plurality of teeth like electrode branches 66e of the reed screen shaped electrode than the plurality of teeth like electrode branches 66e in the concave 94c on one of the pair of both side portions 94a of the substrate elastic holder 94 on which the reed screen shaped electrode of the surface acoustic wave excitation/detection unit 96 is formed. As a result, the attenuation of the propagation energy of the surface acoustic wave in the surface acoustic wave circulation path 42a can be further decreased.

The electrically nonconductive material is used as the substrate elastic holder 64 in this embodiment for a following reason. That is to say, when the substrate elastic holder 64 is formed of electrically conductive material and its surface is coated with an electrically insulating film, it is highly possible that short-circuit of the pair of comb-shaped terminals 96c and 96d of the reed screen shaped electrode occurs through the electrically conductive material coated with the thin electrically insulating film of the substrate elastic holder 94 when the high-frequency signal is applied to the reed screen shaped electrode of the surface acoustic wave excitation/detection unit 96 formed on the surface of the substrate elastic holder 64 to excite the surface acoustic wave.

If the above-described short-circuit of the pair of comb-shaped terminals 96c and 96d of the reed screen shaped electrode can be prevented, the substrate elastic holder 94 can be formed of metal such as stainless having the elasticity and coated with electrically nonconductive material. For example, it is also possible that an entire substrate elastic holder 94 is formed of electrically conductive material such as metal and further only a portion on which the surface acoustic wave excitation/detection unit 96 is formed (the concave 94c in this embodiment) and the vicinity of the same on one of the pair of both side portions 94a of the substrate elastic holder 94 is coated with a material configured to prevent the above-described short-circuit.

The substrate elastic holder 94 configured with the plastic more flexible can hold the outer surface of the surface acoustic wave propagation substrate 42 more stably with improved contact to the outer surface of the surface acoustic wave propagation substrate 42 as far as this exerts necessary elastic resistance against bending. Alternatively, by forming the electrically insulating film more flexible than the plastic, which configures the substrate elastic holder 94, only on the portion, which is brought into contact with the surface acoustic wave circulation path 42a of the surface acoustic wave propagation substrate 42 (that is to say, the concave 94c on which the reed screen shaped electrode of the surface acoustic wave excitation/detection unit 96 is arranged) on one of the pair of the side portions 94a of the substrate elastic holder 94, the contact of the contacting portion (concave 94c) on one of the pair of both side portions 94a of the substrate elastic holder 94 to the outer surface of the surface acoustic wave propagation substrate 42 is improved and the outer surface of the surface acoustic wave propagation substrate 42 can be held more stably.

In this embodiment, an engagement concave 92c is formed in a predetermined position of the support 92 to which the ends 94b of the pair of both side portions 94a of the substrate elastic holder 94 are detachably fixed. By engagement of the ends 94b of the pair of both side portions 94a of the substrate elastic holder 94 configured with material having elasticity and into the substantially U shape with the engagement concave 92c in the predetermined position of the support 92 against its elastic force, the ends 94b of the pair of both side portions 94a of the substrate elastic holder 94 are easily detachably fixed to the engagement concave 92c in the predetermined position of the substrate support 92.

The pair of terminals 92a and 92b of the substrate support 92 are arranged on an inner peripheral surface of the engagement concave 92c. By the engagement of the ends 94b of the pair of both side portions 94a of the substrate elastic holder 94 with the engagement concave 92c of the substrate support 92 against its elastic force, the pair of terminals 92a and 92b of the substrate support 92 are brought into contact with the first and second external connection terminals 96a and 96b of the substrate elastic holder 94 on the ends 94b of the pair of both side portions 94a of the substrate elastic holder 94.

The surface acoustic wave propagation substrate 42 held by the pair of both side end portions 94a of the substrate elastic holder 94 at a position being away from the substrate support 92 on one side of the substrate supporter 92 as illustrated in FIG. 17B can be easily inserted and removed between the pair of both side portions 94a of the substrate elastic holder 94 in a following manner.

First, the ends 94b of the pair of both side portions 94a of the substrate elastic holder 94 are approached each other against its elasticity, and next, the ends 94b of the pair of both side portions 94a are removed from the engagement concave 92c in the predetermined position of the substrate support 92. Thereafter, by moving the ends 94b of the pair of both side portions 94 away from each other by its elasticity, the surface acoustic wave propagation substrate 42 can be easily inserted and removed between the pair of both side portions 94a.

A procedure to allow the pair of both side portions 94a of the substrate elastic holder 94 to hold the surface acoustic wave propagation substrate 42 at the position being away from the substrate support 92 on one side of the substrate support 92 as illustrated in FIG. 17B is as follows.

While the surface acoustic wave propagation substrate 42 is inserted between the pair of both side portions 94a separated from each other of the substrate elastic holder 94, the ends 94b of the pair of both side portions 94a are approached each other against its elasticity, and in this state, the ends 94b of the pair of both side portions 94a are inserted into the engagement concave 92c in the predetermined position of the substrate support 92. Further, the ends 94b of the pair of both side portions 94a are moved away from each other by its elasticity to allow the ends 94b of the pair of both side portions 94a to be engaged with the engagement concave 92c in the predetermined position of the substrate support 92.

At that time, the pair of comb-shaped terminals 96c and 96d of the reed screen shaped electrode of the surface acoustic wave excitation/detection unit 96 provided on the concave 94e on one of the pair of both side portions 94a of the substrate elastic holder 94 are brought into surface contact with the surface acoustic wave circulation path 42a on the outer surface of the surface acoustic wave propagation substrate 42 and the bridge-shaped portion 94d on the other of the pair of both side portions 94a is brought into contact with the both sides of the surface acoustic wave circulation path 42a, which are the region on the outer surface of the surface acoustic wave propagation substrate 42 excluding the surface acoustic wave circulation path 42a. As a result, the pair of comb-shaped terminals 96c and 96d of the reed screen shaped electrode of the surface acoustic wave excitation/detection unit 96 are connected to the operation control unit 50 through the first and second terminals 92a and 92b to which the first and second external connection terminals 96a and 96b provided on the pair of both side portions 94a of the substrate elastic holder 94 are connected on the substrate support 92. Also, nothing is brought into contact with the surface acoustic wave circulation path 42a on the outer surface of the surface acoustic wave propagation substrate 42.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A spherical surface acoustic wave apparatus comprising:
   a surface acoustic wave propagation substrate which includes, on an outer surface thereof, a surface acoustic wave circulation path configured to be annular and continuous using at least a part of a spherical shape, the circulation path being able to be excited to generate a surface acoustic wave therein and to allow the excited surface acoustic wave propagate and circulate therein in an annular and continuous direction thereof;
   a substrate support which is configured to support a region on the outer surface of the surface acoustic wave propagation substrate, the region excluding the surface acoustic wave circulation path;
   a surface acoustic wave excitation/detection unit which is configured to excite the surface acoustic wave in the surface acoustic wave circulation path of the surface acoustic wave propagation substrate, to make the excited surface acoustic wave propagate and circulate in the annular and continuous direction, to detect the surface acoustic wave circulated in the surface acoustic wave circulation path, and to emit a reception signal corresponding to the detected surface acoustic wave; and a support for an excitation/detection unit, which supports an elastic deformation member supporting the surface acoustic wave excitation/detection unit, which makes the surface acoustic wave excitation/detection unit being in contact with the surface acoustic wave circulation path of the outer surface of the surface acoustic wave propagation substrate through the elastic deformation member, and which elastically deforms the elastic deformation member.

2. The spherical surface acoustic wave apparatus according to claim 1, wherein each of the substrate support and the excitation/detection unit support includes a base end portion which is supported by a base, and an extended end portion which is extended from the base end portion in a direction away from the base and which is elastically bendable relative to the base end portion, the extended end portion of the substrate support supports the region on the outer surface of the surface acoustic wave propagation substrate excepting the surface acoustic wave circulation path, the extended end portion of the excitation/detection unit support supports the elastic deformation member, and makes the surface acoustic wave excitation/detection unit being in contact with the surface acoustic wave circulation path on the outer surface of the surface acoustic wave propagation substrate at a position which is opposite to the extended end portion of the substrate support with the surface acoustic wave propagation substrate interposed therebetween, and the surface acoustic wave propagation substrate is elastically sandwiched by the extended end portion of the substrate support and the extended end portion of the excitation/detection unit support at a position being away from the base.

3. The spherical surface acoustic wave apparatus according to claim 2, wherein the surface acoustic wave excitation/detection unit is a reed-screen shaped electrode, and when an electrode width of the reed-screen shaped electrode is W and a radius of the surface acoustic wave circulation path on the surface acoustic wave propagation substrate is R and when the elastic deformation member of the excitation/detection unit support makes the surface acoustic wave excitation/detection unit being in contact with the surface acoustic wave circulation path on the outer surface of the surface acoustic wave propagation substrate, a depth of a depression of the elastic deformation member is $D=R(1-\cos(W/2R))$ or larger than D: wherein (W/2R) in parentheses after "cos" is in radian unit.

4. The spherical surface acoustic wave apparatus according to claim 2, wherein a contacting area decreasing process which decreases a contacting area with the surface acoustic wave circulation path is applied to a surface of a circulation path contacting portion of the surface acoustic wave excitation/detection unit, with the surface of the circulation path contacting portion the surface acoustic wave excitation/detection unit being in contact with the surface acoustic wave circulation path on the outer surface of the surface acoustic wave propagation substrate.

5. The spherical surface acoustic wave apparatus according to claim 4, wherein the contacting area decreasing process includes forming concaves or projections at a plurality of positions on the surface of the circulation path contacting portion of the surface acoustic wave excitation/detection unit.

6. The spherical surface acoustic wave apparatus according to claim 5, wherein the concaves by the contacting area decreasing process are formed by etching.

7. The spherical surface acoustic wave apparatus according to claim 6, wherein the surface acoustic wave excitation/detection unit is a reed-screen shaped electrode, and when an electrode width of the reed-screen shaped electrode is W and a radius of the surface acoustic wave circulation path on the surface acoustic wave propagation substrate is R and when the elastic deformation member of the excitation/detection unit support makes the surface acoustic wave excitation/detection unit being in contact with the surface acoustic wave circulation path on the outer surface of the surface acoustic wave propagation substrate, a depth of a depression of the elastic deformation member is $D=R(1-\cos(W/2R))$ or larger than D: wherein (W/2R) in parentheses after "cos" is in radian unit.

8. The spherical surface acoustic wave apparatus according to claim 5, wherein the surface acoustic wave excitation/detection unit is a reed-screen shaped electrode, and the projections by the contacting area decreasing process are formed by attaching minute particles, each having a diameter of one-quarter or less of a period of arrangement of a plurality of electrode branches of the reed-screen shaped electrode, at the positions on the surface of the circulation path contacting portion of the surface acoustic wave excitation/detection unit.

9. The spherical surface acoustic wave apparatus according to claim 2, wherein the elastic deformation member of the excitation/detection unit support is electrically nonconductive, and the surface acoustic wave excitation/detection unit is formed on the elastic deformation member.

10. The spherical surface acoustic wave apparatus according to claim 1, wherein the substrate support supports the surface acoustic wave propagation substrate with a part of the surface acoustic wave circulation path on the outer surface of the surface acoustic wave propagation substrate externally exposed from a surface of the substrate support, and the excitation/detection unit support brings the surface acoustic wave excitation/detection unit into contact with the exposed part of the surface acoustic wave circulation path on the outer surface of the surface acoustic wave propagation substrate through the elastic deformation member, and elastically deforms the elastic deformation member when the excitation/detection unit support is fixed to a predetermined position on the surface of the substrate support.

11. The spherical surface acoustic wave apparatus according to claim 10, wherein the substrate support supports a plurality of surface acoustic wave propagation substrates with a part of the surface acoustic circulation path on the outer surface of each of the surface acoustic wave propagation substrates externally exposed from the surface of the substrate support, and the excitation/detection unit support comprises the elastic deformation member which is brought into contact with the exposed part of the surface acoustic wave circulation path on the outer surface of each of the surface acoustic wave propagation substrates supported by the substrate support and which is elastically deformed when the excitation/detection unit support is fixed to the predetermined position on the surface of the substrate support.

12. The spherical surface acoustic wave apparatus according to claim 3, wherein
the elastic deformation member of the excitation/detection unit support is electrically nonconductive, and
the surface acoustic wave excitation/detection unit is formed on the elastic deformation member.

13. The spherical surface acoustic wave apparatus according to claim 4, wherein
the elastic deformation member of the excitation/detection unit support is electrically nonconductive, and
the surface acoustic wave excitation/detection unit is formed on the elastic deformation member.

14. The spherical surface acoustic wave apparatus according to claim 5, wherein
the elastic deformation member of the excitation/detection unit support is electrically nonconductive, and
the surface acoustic wave excitation/detection unit is formed on the elastic deformation member.

15. The spherical surface acoustic wave apparatus according to claim 6, wherein
the elastic deformation member of the excitation/detection unit support is electrically nonconductive, and
the surface acoustic wave excitation/detection unit is formed on the elastic deformation member.

16. The spherical surface acoustic wave apparatus according to claim 7, wherein
the elastic deformation member of the excitation/detection unit support is electrically nonconductive, and
the surface acoustic wave excitation/detection unit is formed on the elastic deformation member.

17. The spherical surface acoustic wave apparatus according to claim 8, wherein
the elastic deformation member of the excitation/detection unit support is electrically nonconductive, and
the surface acoustic wave excitation/detection unit is formed on the elastic deformation member.

18. A spherical surface acoustic wave apparatus comprising:
a surface acoustic wave propagation substrate which includes, on an outer surface thereof, a surface acoustic wave circulation path configured to be annular and continuous using at least a part of a spherical shape, the circulation path being able to be excited to generate a surface acoustic wave therein and to allow the excited surface acoustic wave propagate and circulate therein in an annular and continuous direction thereof;
a substrate supporting unit which is configured to support the surface acoustic wave propagation substrate; and
a surface acoustic wave excitation/detection unit which excites and circulates the surface acoustic wave in the surface acoustic wave circulation path on the outer surface of the surface acoustic wave propagation substrate and which detects the circulated surface acoustic wave,
wherein the substrate supporting unit comprises;
a substrate support which includes a substrate seat on which a region on the outer surface of the surface acoustic wave propagation substrate is seated, the region excluding the surface acoustic wave circulation path, and
a substrate elastic holder which generates elastic resistance against bending, which has a contact portion being brought into contact with a portion on the outer surface of the surface acoustic wave propagation substrate mounted on the substrate seat of the substrate support, the portion on the outer surface excluding the surface acoustic wave circulation path and being opposite to the substrate seat of the substrate support, which is pressed at both sides of the contact portion against the elastic resistance toward the substrate support, and which is fixed at end portions of the both sides to positions away from the substrate seat on both sides of the substrate seat on the substrate support,
wherein engagement concaves, to which the end portions of the both sides of the substrate elastic holder are inserted and with which the end portions of the both sides of the substrate elastic holder are engaged against the elastic resistance, are formed in positions away from the substrate seat on both sides of the substrate seat on the substrate support,
wherein an angle between a first straight line and a second straight line is 70 degrees or smaller,
the first straight line connecting a first contact point, at which the substrate elastic holder is brought into contact with a portion of the outer surface of the surface acoustic wave propagation substrate mounted on the substrate seat of the substrate support, the portion being opposite side of the substrate seat of the substrate support, and a second contact point, at which each of the end portions of the both sides of the substrate elastic holder is first brought into contact with the engagement concave corresponding thereto, and
the second straight line connecting the second contact point and a third contact point, at which the outer surface of the surface acoustic wave propagation substrate is brought into contact with the substrate seat of the substrate support on a side of the second contact point.

19. The spherical surface acoustic wave apparatus according to claim 18, wherein
the surface acoustic wave excitation/detection unit is provided on the surface acoustic wave circulation path on the outer surface of the surface acoustic wave propagation substrate, and comprises a first external connection terminal and a second external connection terminal, the first external connection terminal arranged on the outer surface of the surface acoustic wave propagation substrate at a portion being in contact with the substrate elastic holder on a side being opposite to the substrate seat of the substrate support, and the second external connection terminal arranged on the outer surface of the surface acoustic wave propagation substrate at a portion being seated on the substrate seat of the substrate support,
the substrate elastic holder comprises a conducting path extending between a portion thereof, which is brought into contact with the first external connection terminal on the side being opposite to the substrate seat of the substrate support on the outer surface of the surface acoustic wave propagation substrate, and a portion of at least one of the end portions of the both ends thereof, which is brought into contact with an inner surface of the engagement concave corresponding thereto, and
the substrate support comprises a first terminal and a second terminal, the first terminal being brought into contact with the second external connection terminal on the outer surface of the surface acoustic wave propagation substrate, on the substrate seat, and the second terminal being brought into contact with the conducting path of the substrate elastic holder in the engagement concave corresponding to the at least one of the end portions of the both ends of the substrate elastic holder.

20. The spherical surface acoustic wave apparatus according to claim 19, wherein
the substrate elastic holder is formed of a material with electrical conductivity.

21. A spherical surface acoustic wave apparatus comprising:
a surface acoustic wave propagation substrate which includes, on an outer surface thereof, a surface acoustic wave circulation path configured to be annular and continuous using at least a part of a spherical shape, the circulation path being able to be excited to generate a surface acoustic wave therein and to allow the excited surface acoustic wave propagate and circulate therein in an annular and continuous direction thereof;
a substrate supporting unit which is configured to support the surface acoustic wave propagation substrate; and
a surface acoustic wave excitation/detection unit which excites and circulates the surface acoustic wave in the surface acoustic wave circulation path on the outer surface of the surface acoustic wave propagation substrate and which detects the circulated surface acoustic wave,
wherein the substrate supporting unit comprises:
a substrate support which includes a substrate seat on which a region on the outer surface of the surface acoustic wave propagation substrate is seated, the region excluding the surface acoustic wave circulation path, and
a substrate elastic holder which generates elastic resistance against bending, which has a contact portion being brought into contact with a portion of the surface acoustic wave circulation path on the outer surface of the surface acoustic wave propagation substrate mounted on the substrate seat of the substrate support, the portion of the surface acoustic wave circulation path being opposite to the substrate seat of the substrate support, which is pressed at both sides of the contact portion against the elastic resistance toward the substrate support, and which is fixed at end portions of the both sides to positions away from the substrate seat on both sides of the substrate seat on the substrate support, and
wherein the surface acoustic wave excitation/detection unit is provided on the contact portion of the substrate elastic holder.

22. The spherical surface acoustic wave apparatus according to claim 21, wherein
engagement concaves, to which the end portions of the both sides of the substrate elastic holder are inserted and with which the end portions of the both sides of the substrate elastic holder are engaged against the elastic resistance, are formed in positions away from the substrate seat on both sides of the substrate seat on the substrate support, and
an angle between a first straight line and a second straight line is 70 degrees or smaller,
the first straight line connecting a first contact point, at which the substrate elastic holder is brought into contact with a portion of the outer surface of the surface acoustic wave propagation substrate mounted on the substrate seat of the substrate support, the portion being opposite side of the substrate seat of the substrate support, and a second contact point, at which each of the end portions of the both sides of the substrate elastic holder is first brought into contact with the engagement concave corresponding thereto, and
the second straight line connecting the second contact point and a third contact point, at which the outer surface of the surface acoustic wave propagation substrate is brought into contact with the substrate seat of the substrate support on a side of the second contact point.

* * * * *

UNITED STATES PATENT AND TRADEMARK OFFICE
CERTIFICATE OF CORRECTION

PATENT NO. : 8,436,511 B2
APPLICATION NO. : 12/929925
DATED : May 7, 2013
INVENTOR(S) : Noritaka Nakaso Page 1 of 1

It is certified that error appears in the above-identified patent and that said Letters Patent is hereby corrected as shown below:

In the Claims:

Column 53, Line 65, In Claim 18, delete "comprises;" and insert -- comprises --, therefor.

Signed and Sealed this
Seventeenth Day of September, 2013

Teresa Stanek Rea
*Deputy Director of the United States Patent and Trademark Office*